(12) United States Patent
Chao et al.

(10) Patent No.: US 9,958,755 B2
(45) Date of Patent: May 1, 2018

(54) ELECTRONIC DEVICE

(71) Applicant: AVER INFORMATION INC., New Taipei (TW)

(72) Inventors: Hung-Wen Chao, New Taipei (TW); Ming-Te Cheng, New Taipei (TW)

(73) Assignee: AVER INFORMATION INC., New Taipei (TW)

( * ) Notice: Subject to any disclaimer, the term of this patent is extended or adjusted under 35 U.S.C. 154(b) by 0 days. days.

(21) Appl. No.: 15/592,513

(22) Filed: May 11, 2017

(65) Prior Publication Data
US 2017/0329205 A1 Nov. 16, 2017

(30) Foreign Application Priority Data
May 13, 2016 (TW) .................................. 105114980

(51) Int. Cl.
| G03B 11/04 | (2006.01) |
|---|---|
| H05K 5/03 | (2006.01) |
| H04N 5/225 | (2006.01) |
| H05K 5/02 | (2006.01) |

(52) U.S. Cl.
CPC ......... *G03B 11/043* (2013.01); *H04N 5/2254* (2013.01); *H04N 5/2257* (2013.01); *H05K 5/0217* (2013.01); *H05K 5/03* (2013.01)

(58) Field of Classification Search
None
See application file for complete search history.

(56) References Cited

U.S. PATENT DOCUMENTS

| 7,708,479 | B2* | 5/2010 | Watanabe | H04N 1/00307 348/342 |
|---|---|---|---|---|
| 2009/0074400 | A1* | 3/2009 | Machida | G03B 11/043 396/448 |
| 2010/0166414 | A1* | 7/2010 | Zhang | G03B 11/043 396/448 |
| 2010/0202770 | A1* | 8/2010 | Kihara | G03B 9/14 396/493 |
| 2011/0279897 | A1* | 11/2011 | Ohuchi | G03B 11/043 359/511 |
| 2013/0036676 | A1* | 2/2013 | Tani | H04M 1/0264 49/414 |
| 2013/0088639 | A1* | 4/2013 | Mundt | H04N 5/2251 348/372 |

(Continued)

FOREIGN PATENT DOCUMENTS

TW M278160 U 10/2005

*Primary Examiner* — W B Perkey
(74) *Attorney, Agent, or Firm* — Maschoff Brennan

(57) ABSTRACT

An electronic device includes a casing, a supporting member, a sliding lid and an elastic member. The casing has a window. The supporting member is in the casing and has a through hole. The sliding lid is slidably disposed on the supporting member so that the sliding lid is slidable between an opened position and a closed position. The through hole is connected to the window when the sliding lid is located at the opened position, and the sliding lid is located between the through hole and the window when the sliding lid is located at the closed position. The elastic member is located on the same side of the sliding lid and the supporting member. One end of the elastic member is disposed on the sliding lid, and another end of the elastic member is disposed on the supporting member.

9 Claims, 26 Drawing Sheets

(56) References Cited

U.S. PATENT DOCUMENTS

2015/0198862 A1* 7/2015 Murakami ........... G03B 11/043
                                                        396/501
2017/0315425 A1* 11/2017 Foster ................. G03B 11/043
2017/0329205 A1* 11/2017 Chao .................... G03B 11/043

* cited by examiner

ELECTRONIC DEVICE

CROSS-REFERENCE TO RELATED APPLICATIONS

This non-provisional application claims priority under 35 U.S.C. § 119(a) on Patent Application No(s). 105114980 filed in Taiwan, R.O.C. on May 13, 2016, the entire contents of which are hereby incorporated by reference.

TECHNICAL FIELD

The disclosure relates to an electronic device, more particularly to an electronic device having sliding lid.

BACKGROUND

With the development of technology, the electronic devices, such as smart phones, projectors, interactive devices or the like which have an image capturing module for recording or capturing images, are widely used in daily life. In general, the electronic devices are usually equipped with a sliding lid for protecting the lens of the image capturing module, the sliding lid can prevent dust from falling on the lens and also protect the lens from being damaged, scratched, scuffed or dirtied when the image capturing module is not in use.

However, the sliding lid on the traditional electronic device is usually not able to be fully opened or closed. The lens of the image capturing module under the sliding lid is exposed when the sliding lid is not fully closed, so the sliding lid is not able to completely protect the lens. In addition, the sliding lid will block the view of the lens when the sliding lid is not fully opened.

SUMMARY

The present disclosure provides an electronic device for solving the problems that the sliding lid on the traditional electronic device is usually not fully opened or closed.

One embodiment of the disclosure provides an electronic device including a casing, a supporting member, a sliding lid and an elastic member. The casing has a window. The supporting member is disposed in the casing and has a through hole. The sliding lid is slidably disposed on the supporting member so that the sliding lid is slidable between an opened position and a closed position. The through hole is connected to the window when the sliding lid is located at the opened position, and the sliding lid is located between the through hole and the window when the sliding lid is located at the closed position. The elastic member is located on the same side of the sliding lid and the supporting member. One end of the elastic member is disposed on the sliding lid, and another end of the elastic member is disposed on the supporting member so that the elastic member releases elastic energy to force the sliding lid to move to the closed position or the opened position when the sliding lid slides on the supporting member.

One embodiment of the disclosure provides an electronic device including a casing, a supporting member, a sliding lid and two elastic members. The casing has a window. The supporting member is disposed in the casing and has a through hole. The sliding lid is slidably disposed on the supporting member so that the sliding lid is slidable between an opened position and a closed position. The through hole is connected to the window when the sliding lid is located at the opened position, and the sliding lid is located between the through hole and the window when the sliding lid is located at the closed position. The sliding lid further has a protrusion which protrudes from a side of the sliding lid which is opposite to the window. The two elastic members are located on the same side of the sliding lid and the supporting member. Each of the two elastic members has a coiled part and an arm. The coiled part is pivoted to the supporting member. The arm has a pressable section and a fixed section. The pressable section is connected between the coiled part and the fixed section. The pressable section of one of the arms is closer to the other arm than its connected fixed section and coiled part. A distance between the two pressable sections is less than a width of the protrusion of the sliding lid. The two pressable sections are movable in a moving direction of the protrusion so that two elastic members release elastic energy to force the sliding lid to move to the closed position or the opened position when the sliding lid slides on the supporting member.

One embodiment of the disclosure provides an electronic device including a casing, a supporting member, a sliding lid and an elastic member. The casing has a window. The supporting member is disposed in the casing and has a through hole. The sliding lid is slidably disposed on the supporting member so that the sliding lid is slidable between an opened position and a closed position. The through hole is connected to the window when the sliding lid is located at the opened position, and the sliding lid is located between the through hole and the window when the sliding lid is located at the closed position. The sliding lid further has a protrusion which protrudes from a side of the sliding lid which is opposite to the window. The elastic member is located on the same side of the sliding lid and the supporting member. The elastic member has a first fixed section, two pressable sections and two second fixed sections. The first fixed section is fixed on the supporting member. The two pressable sections are respectively connected to two sides of the first fixed section, which are opposite to each other, and respectively connected between the first fixed section and the two second fixed section. One end of each of the second fixed sections is movably disposed on the casing. A distance between the two pressable sections is less than a width of the protrusion of the sliding lid. The two pressable sections are movable in a moving direction of the protrusion so that the elastic member releases elastic energy to force the sliding lid to move to the closed position or the opened position when the sliding lid slides on the supporting member.

According to the electronic devices as discussed above, the elastic member is able to force the sliding lid to move to the opened position or the closed position, so the sliding lid is able to be fully opened and closed. Therefore, the sliding lid is prevented from blocking the view of the image capturing module when the image capturing module is in use, and is able to protect the lens of the image capturing module when the image capturing module is not in use.

In addition, the elastic member is disposed on the same side of the sliding lid and the supporting member, which makes the assembly process easier and more efficient.

BRIEF DESCRIPTION OF THE DRAWINGS

The present disclosure will become more fully understood from the detailed description given hereinbelow and the accompanying drawings which are given by way of illustration only and thus are not limitative of the present disclosure and wherein.

DETAILED DESCRIPTION

Figure 1:
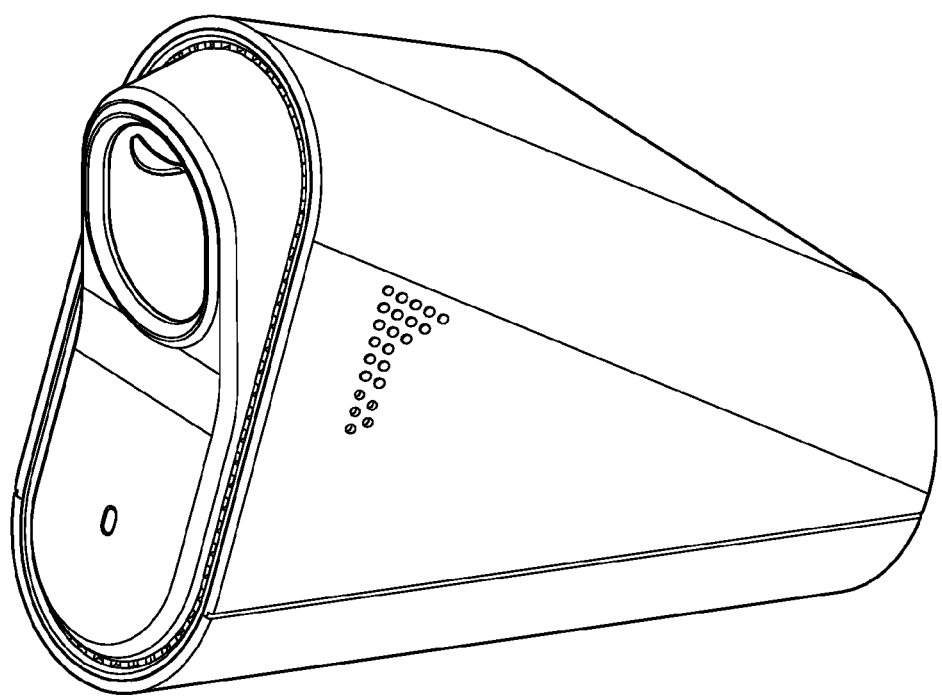
FIG. 1 is a schematic view of an electronic device according to a first embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
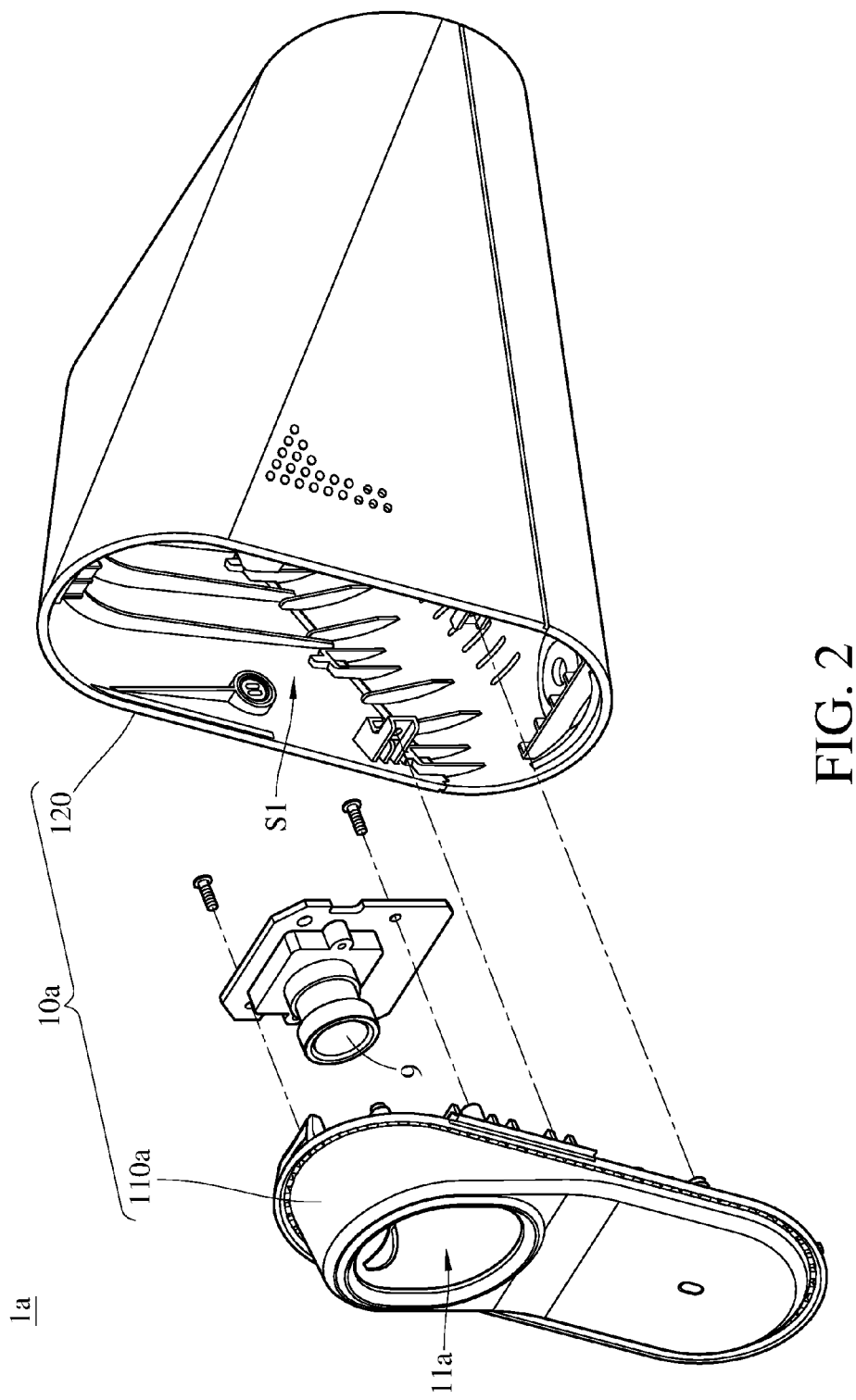
FIG. 2 is an exploded view of the electronic device according to the first embodiment of the disclosure.

Please refer to FIG. 1 to FIG. 2, FIG. 1 is a schematic view of an electronic device according to a first embodiment of the disclosure, and FIG. 2 is an exploded view of the electronic device according to the first embodiment of the disclosure. As shown in FIG. 1, an electronic device 1a is provided. The electronic device 1a is, for example, an educational device or an interactive device for educational activities. As shown in FIG. 2, the electronic device 1a includes a casing 10a and an image capturing module 9. The casing 10a includes a front cover 110a and a base 120. The front cover 110a is detachably disposed on the base 120, and the front cover 110a and the base 120 together define an accommodating space S1. The image capturing module 9 is accommodated in the accommodating space S1. The image capturing module 9 is configured for recording or capturing images. In addition, in this embodiment, the casing 10a has a window 11a located on the front cover 110a. The window 11a extends through two sides of the front cover 110a. The image capturing module 9 faces the window 11a. Furthermore, there are some other required electronic components (not shown) accommodated in the accommodating space S1, but the present disclosure is not limited thereto.

Figure 3:
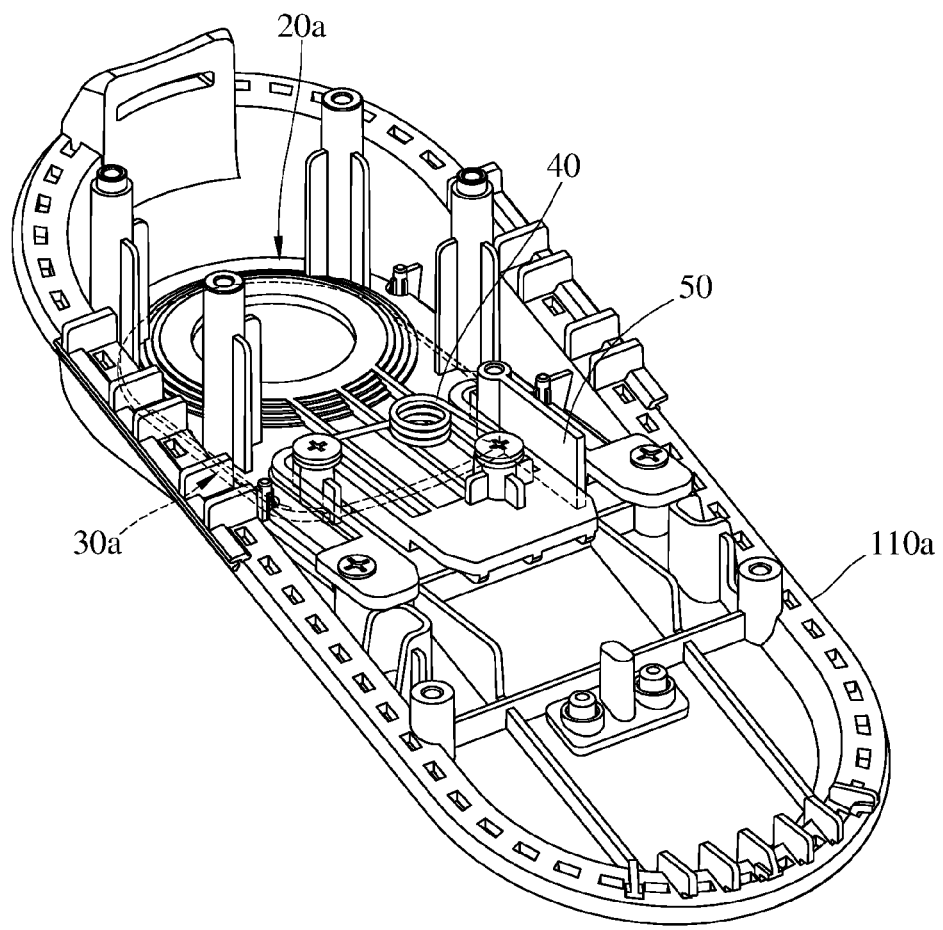
FIG. 3 is a partial perspective view of the electronic device according to the first embodiment of the disclosure.
Figure 4A:
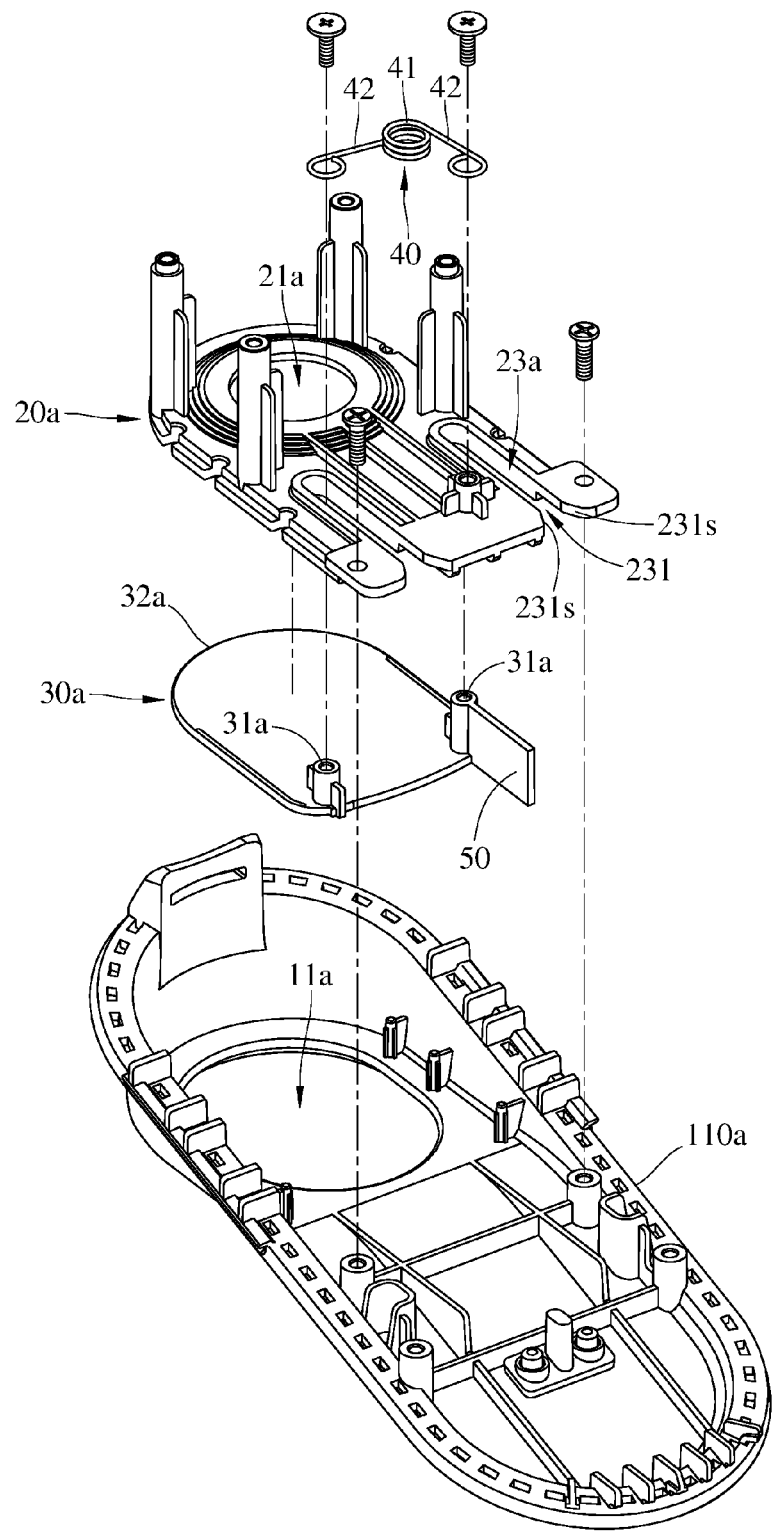
FIGS. 4A-4B are partial exploded views of the electronic device taken from different viewpoints according to the first embodiment of the disclosure.
Figure 4B:
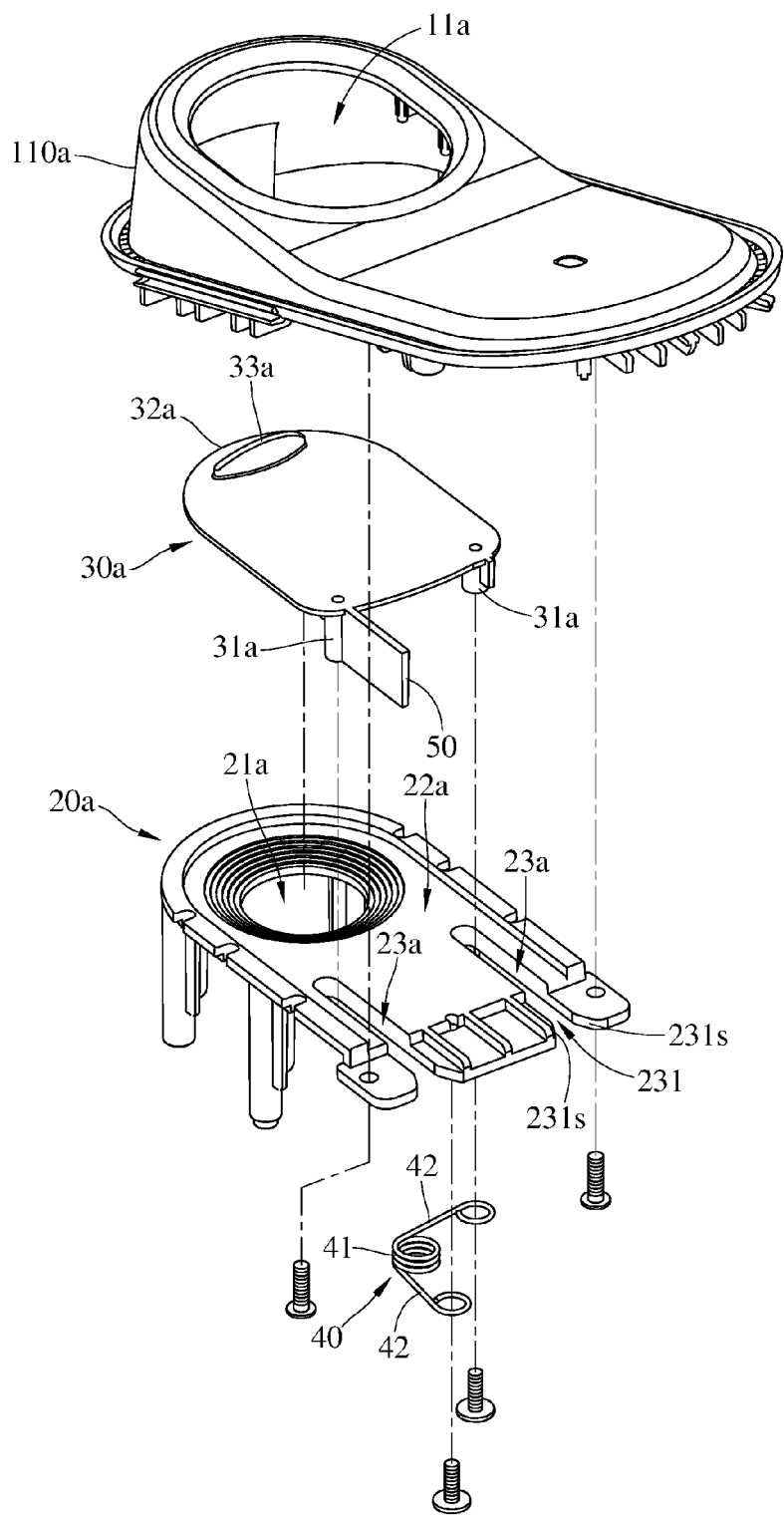

Then, please refer to FIG. 3 to FIG. 4B, FIG. 3 is a partial perspective view of the electronic device according to the first embodiment of the disclosure, and FIGS. 4A-4B are partial exploded views of the electronic device taken from different viewpoints according to the first embodiment of the disclosure. In this embodiment, the electronic device 1a further includes a supporting member 20a, a sliding lid 30a, an elastic member 40 and a light blocking member 50. Please refer back to FIG. 2, the supporting member 20a, the sliding lid 30a, the elastic member 40 and the light blocking member 50 are accommodated in the accommodating space S1.

The supporting member 20a is disposed on the front cover 110a of the casing 10a. In this embodiment, the supporting member 20a has a through hole 21a, a first groove 22a and two second grooves 23a. The through hole 21a extends through two sides of the supporting member 20a and is connected to the accommodating space S1. The first groove 22a is located on a side of the supporting member 20a which faces the window 11a. The first groove 22a is connected to the through hole 21a. The two second grooves 23a are located on a side of the supporting member 20a which is away from the through hole 21a. Each of the two second grooves 23a has an opening 231 and two guiding surfaces 231s. The opening 231 is defined by the two guiding surfaces 231s.

In this embodiment, the sliding lid 30a is slidably located in the first groove 22a of the supporting member 20a, so the sliding lid 30 is slidable between an opened position and a closed position. The usage of the sliding lid 30a is described later in more detail.

The sliding lid 30a has two protrusions 31a, a front edge 32a and a stopper 33a. The front edge 32a means an edge of the sliding lid 30a which is close to the window 11a. The two protrusions 31a protrude from a side of the sliding lid 30a which is opposite to the window 11a, and the two protrusions 31a are located on a side of the sliding lid 30a which is away from the front edge 32a. The stopper 33a protrudes from a side of the sliding lid 30a which faces the window 11a, and the stopper 33a is located in the window 11a.

In this embodiment, the elastic member 40 is a torsion spring having a coiled part 41 and two arms 42. The two arms 42 are respectively connected to two sides of the coiled part 41 which are opposite to each other. The two arms 42 are respectively pivoted to one of the protrusions 31a of the sliding lid 30a and the supporting member 20a. In the elastic member 40, an end where the arm 42 is pivoted to the supporting member 20a is a pivot point of the elastic member 40, and the other end where the other arm 42 is pivoted to the sliding lid 30a is movable relative to the pivot point. When the sliding lid 30a is not moved, the two arms 42 are spread out by the coiled part 41. When the sliding lid 30a is moved to press against the end where the arm 42 is pivoted to the sliding lid 30a (i.e. the movable end), an angle between the two arms 42 is decreased, and the two arms 42 are getting close to each other to force the coiled part 41 to twist to store mechanical energy (i.e. elastic energy).

In addition, as shown in FIG. 4A or FIG. 4B, the elastic member 40 is located on the same side of the sliding lid 30a and the supporting member 20a, which makes the assembly process of the elastic member 40 easier and more efficient.

In this embodiment, the light blocking member 50 is disposed on the sliding lid 30a which is away from the window 11a, and the light blocking member 50 protrudes from the sliding lid 30a, but the present disclosure is not limited thereto. In this embodiment, the light blocking member 50 in corporation with the sliding lid 30a is used to turn on or turn off the image capturing module 9.

Figure 5A:
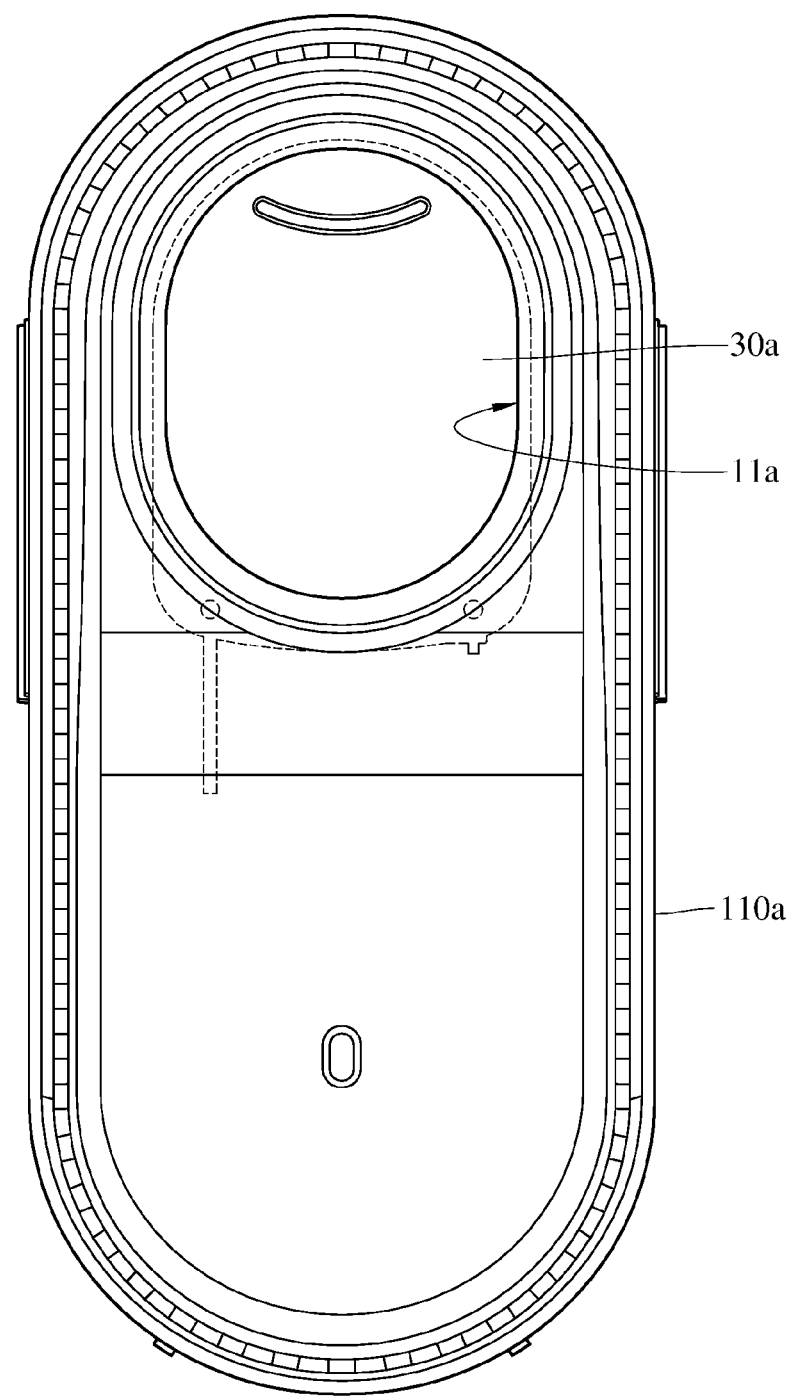
FIG. 5A is a partial front view of the electronic device when its sliding lid is located at a closed position according to the first embodiment of the disclosure.
Figure 5B:
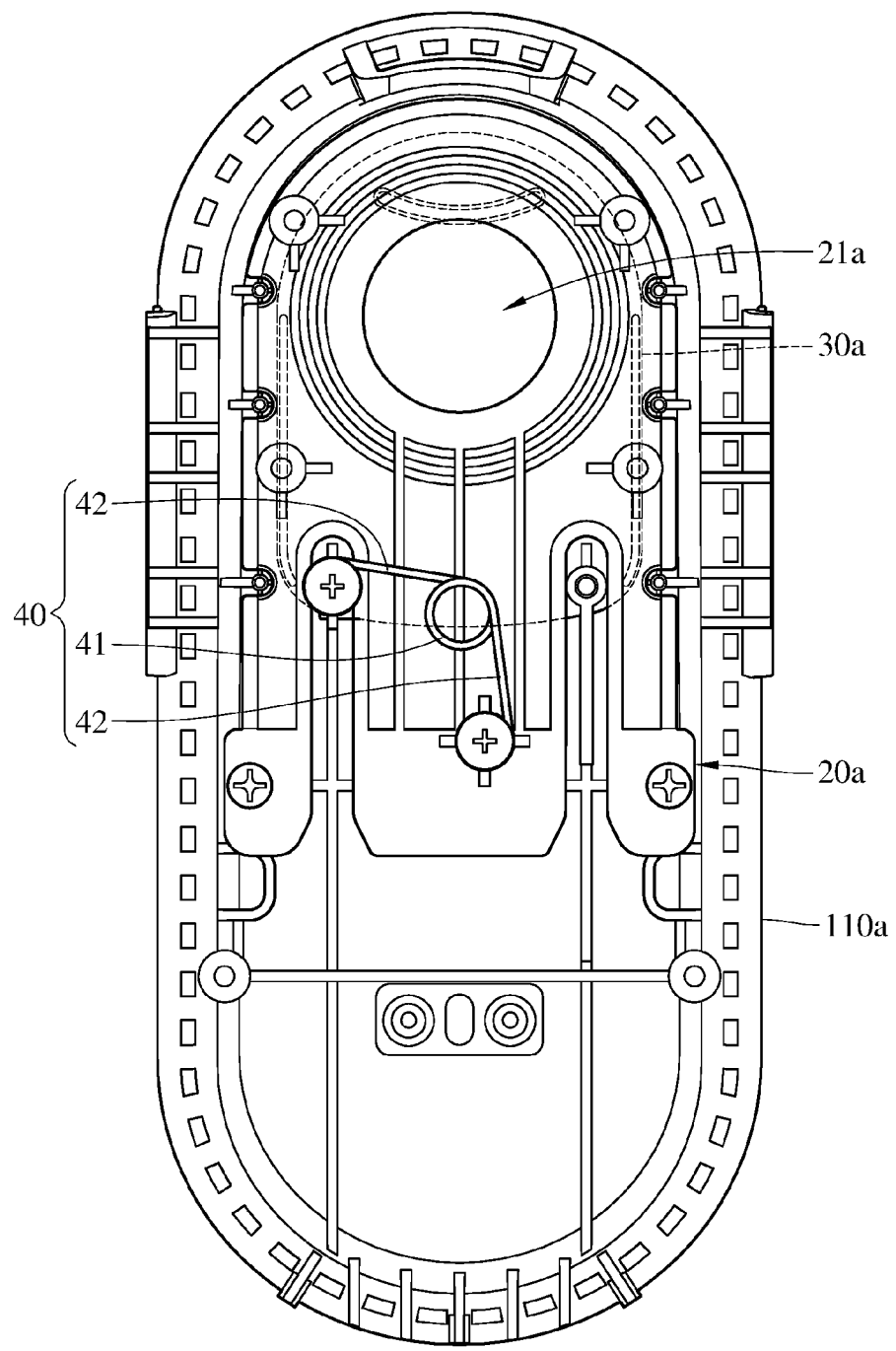
FIG. 5B is a partial back view of the electronic device in FIG. 5A.
Figure 5C:
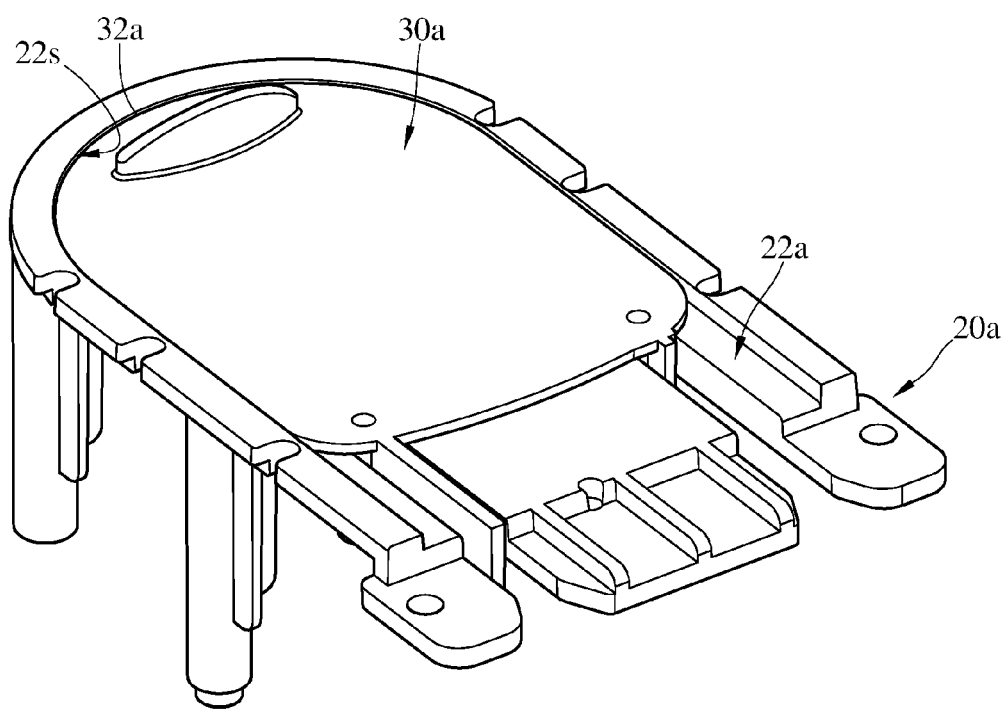
FIG. 5C is a schematic view of a supporting member and the sliding lid in FIG. 5B.

Then, please refer to FIGS. 5A-5C, FIG. 5A is a partial front view of the electronic device when its sliding lid is located at a closed position according to the first embodiment of the disclosure, FIG. 5B is a partial back view of the electronic device in FIG. 5A, and FIG. 5C is a schematic view of a supporting member and the sliding lid in FIG. 5B.

Firstly, as shown in FIG. 5A, the sliding lid 30a is located at the closed position. In such a case, the sliding lid 30a is located between the window 11a of the casing 10a and the through hole 21a of the supporting member 20a so that the sliding lid 30a blocks the through hole 21a for protecting the lens of the image capturing module 9. As shown in FIGS. 5B-5C, the coiled part 41 of the elastic member 40 keeps the two arms 42 to spread out, and thereby forcing the front edge 32s of the sliding lid 30a to abut against a side wall 22s of the first groove 22a. Therefore, the sliding lid 30a is perfectly positioned at the closed position so that the sliding lid 30a is fully closed.

Figure 6A:
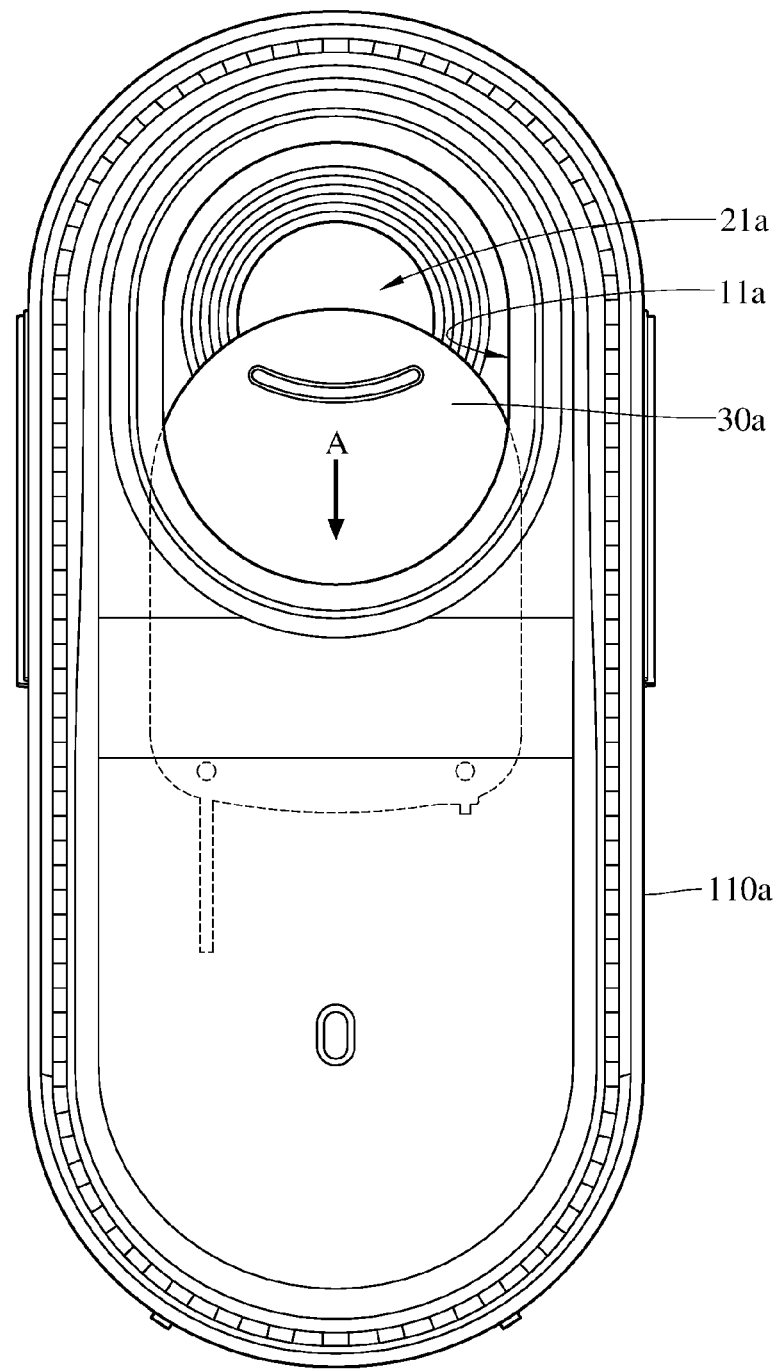
FIG. 6A is a partial front view of the electronic device when the sliding lid is located between the closed position and an opened position.
Figure 6B:
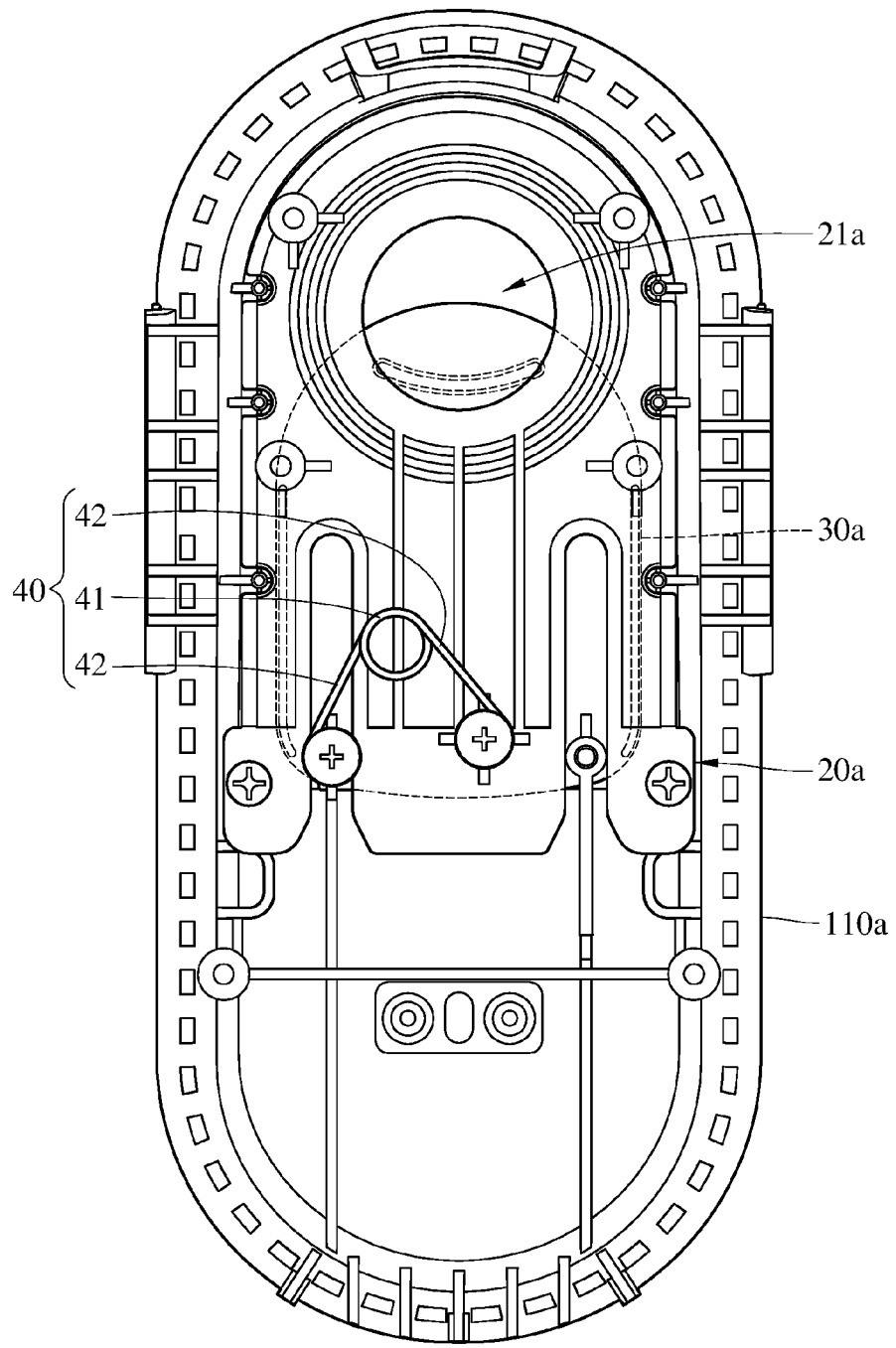
FIG. 6B is a partial back view of the electronic device in FIG. 6A.

Then, please refer to FIGS. 6A-6B, FIG. 6A is a partial front view of the electronic device when the sliding lid is located between the closed position and an opened position, and FIG. 6B is a partial back view of the electronic device in FIG. 6A.

As shown in FIG. 6A, the user is able to slide the sliding lid 30a in the direction of arrow A to away from the closed position, so the sliding lid 30a is moved away from the window 11a to leave the through hole 21s of the supporting member 20a exposed. In such a case, as shown in FIG. 6B, the protrusion 31a of the sliding lid 30a forces its connected arm 42 to move toward the other arm 42 to decrease the angle between the two arms 42, so the coiled part 41 is twisted and stores mechanical energy.

Figure 7A:
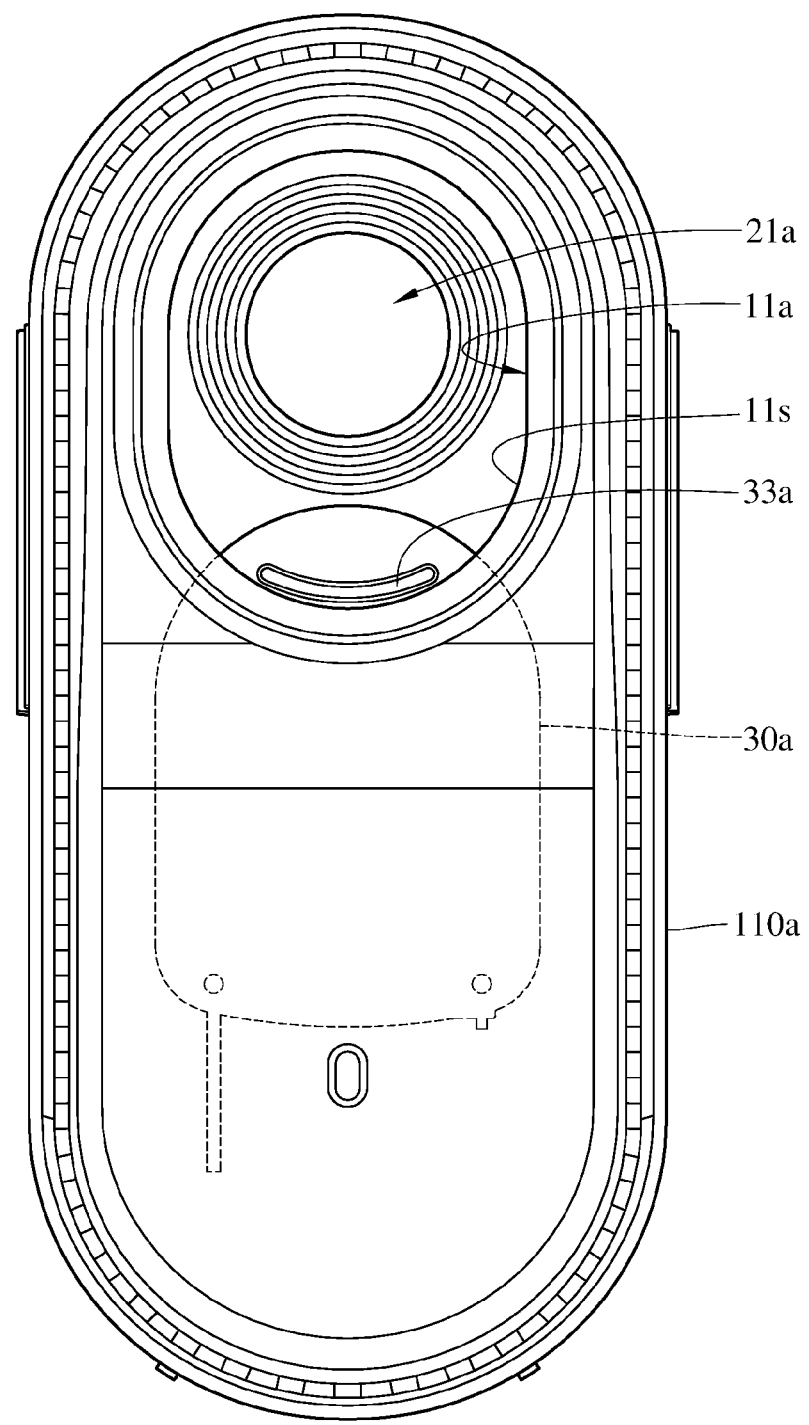
FIG. 7A is a partial front view of the electronic device when the sliding lid is located at the opened position according to the first embodiment of the disclosure.
Figure 7B:
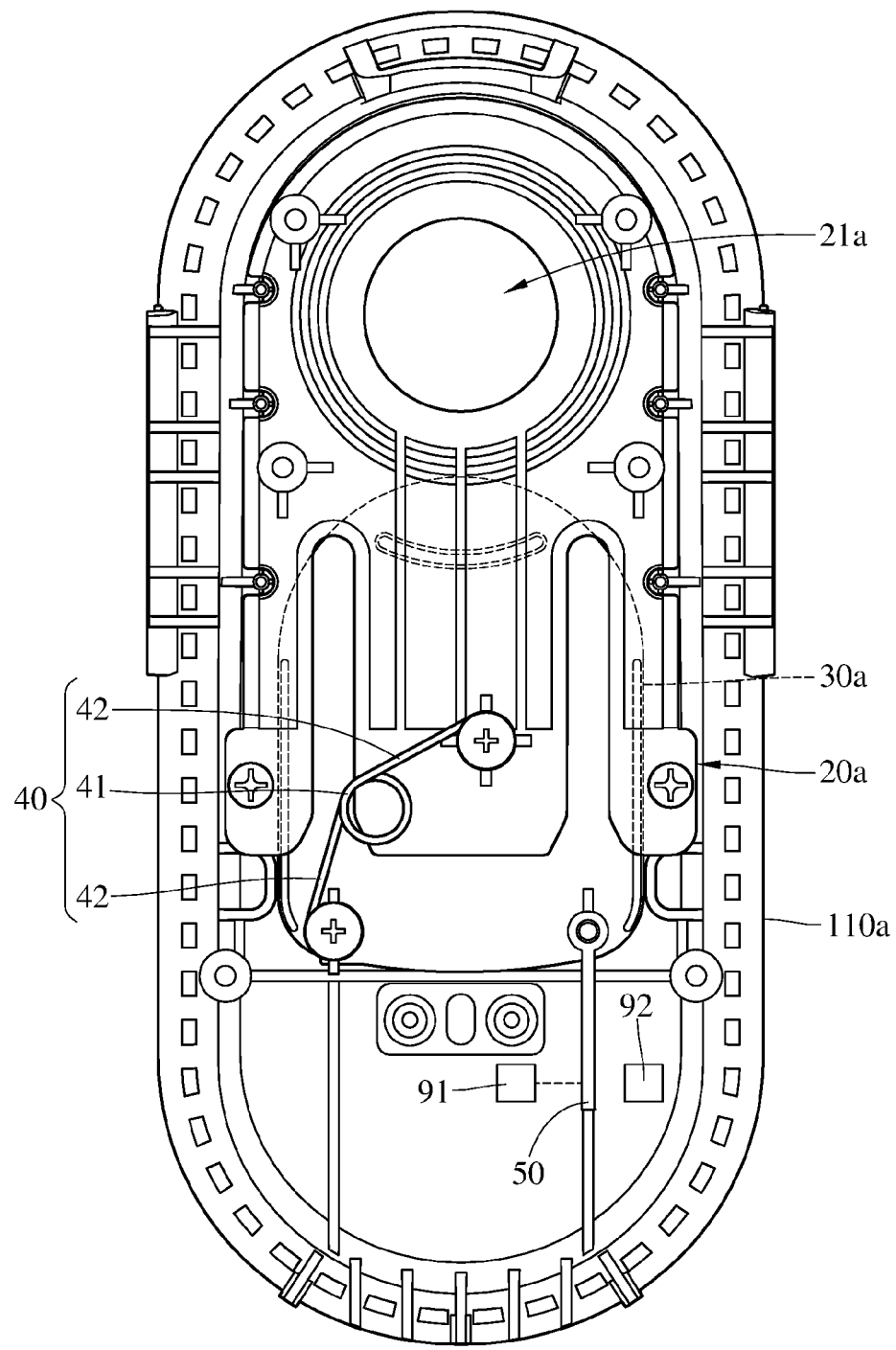
FIG. 7B is a partial back view of the electronic device in FIG. 7A.

Then, please refer to FIGS. 6A-6B and further refer to FIGS. 7A-7B, FIG. 7A is a partial front view of the electronic device when the sliding lid is located at the opened position according to the first embodiment of the disclosure, and FIG. 7B is a partial back view of the electronic device in FIG. 7A. During the movement of the sliding lid 30a from the position in FIG. 6B to the position in FIG. 7B, the coiled part 41 of the elastic member 40 releases the stored mechanical energy to spread out the two arms 42, and thereby the sliding lid 30a is moved to the opened position and fully opened. Hence, the sliding lid 30a is not located between the through hole 21a and the window 11a, so the through hole 21a and the window 11a are connected to each other, and the view of the image capturing module 9 is not blocked by the sliding lid 30a.

In addition, as shown in FIG. 7A, when the sliding lid 30a is located at the opened position, the stopper 33a of the sliding lid 30a abuts against a side wall 11s of the window 11a. Therefore, the sliding lid 30a is stayed at the opened position by the stopper 33a.

Furthermore, as shown in FIG. 7B, the light blocking member 50 moved with the sliding lid 30a blocks a light beam emitted from a light emitting element 91 to a light receiving element 92, so the image capturing module 9 receives a turn-on signal to be turned on. However, the present disclosure is not limited to the positions of the light emitting element 91 and the light receiving element 92.

The above discussion is merely illustrative of the movement of the sliding lid 30a from the closed position to the opened position, and it is unambiguous that the sliding lid 30a can be moved back to the closed position by the aforementioned steps in reversed order. When the sliding lid 30a is moved from the opened position to the closed position, the two guiding surfaces 231s are able to guide the protrusion 31a to enter into the second groove 23a from the opening 231. In addition, the light blocking member 50 moved with the sliding lid 30a does not block the light beam emitted from the light emitting element 91, so the image capturing module 9 receives a turn-off signal to be turned off.

Figure 8:
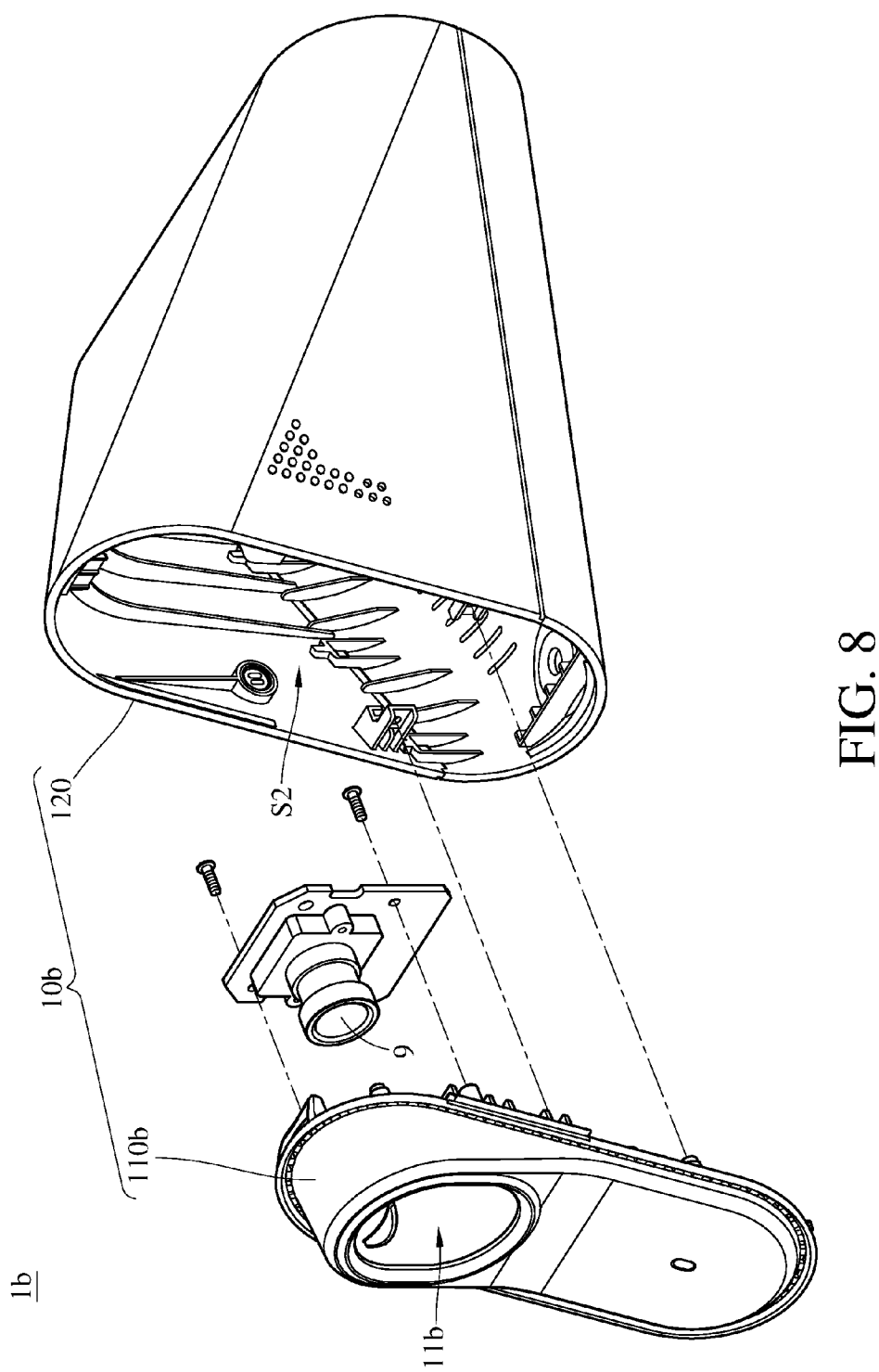
FIG. 8 is an exploded view of an electronic device according to a second embodiment of the disclosure.
Figure 9:
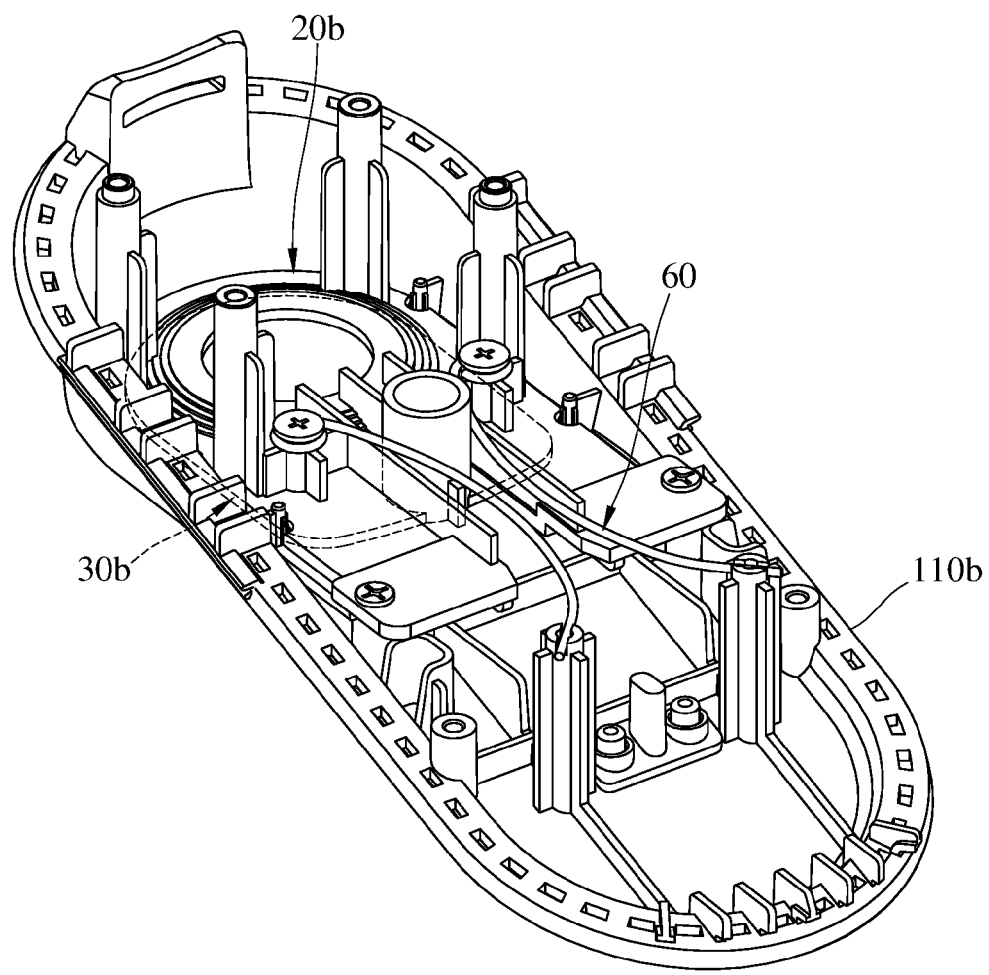
FIG. 9 is a partial perspective view of the electronic device according to the second embodiment of the disclosure.

Then, please refer to FIG. 8, which is an exploded view of an electronic device according to a second embodiment of the disclosure. In this embodiment, an electronic device 1b is provided, and the purpose and the configuration of the electronic device 1b are similar to that of the electronic device 1a. As shown in FIG. 8. the electronic device 1b includes a casing 10b and the image capturing module 9. The casing 10b includes a front cover 110b and a base 120. The front cover 110b is detachably disposed on the base 120, and the front cover 110b and the base 120 together define an accommodating space S2. The image capturing module 9 is accommodated in the accommodating space S2 for recording or capturing images. In addition, in this embodiment, the casing 10b has a window 11b located on the front cover 110b. The window 11b extends through two sides of the front cover 110b. The image capturing module 9 faces the window 11b. Furthermore, there are some other required electronic components (not shown) accommodated in the accommodating space S2, but the present disclosure is not limited thereto.

Figure 10A:
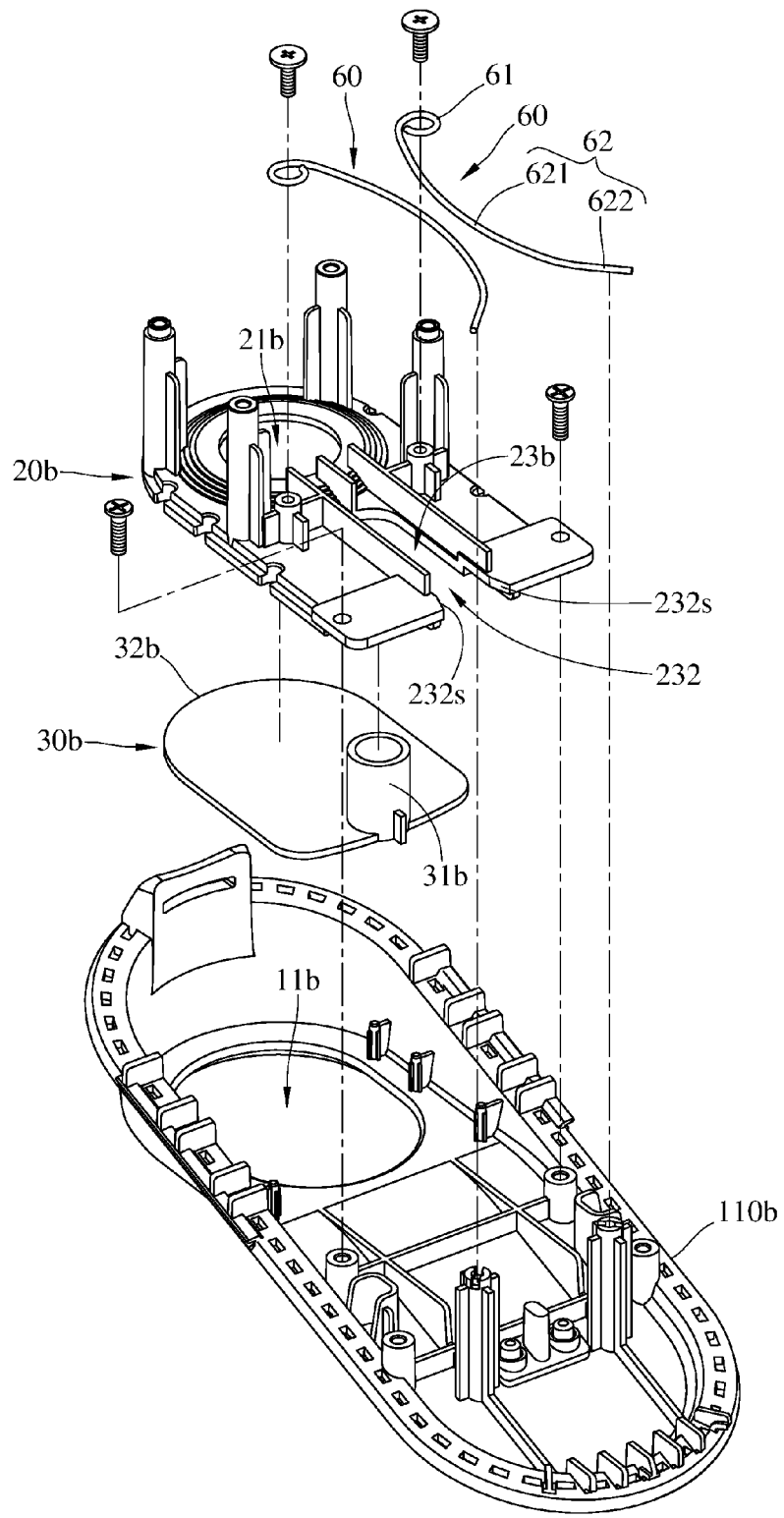
FIGS. 10A-10B are partial exploded views of the electronic device taken from different viewpoints according to the second embodiment of the disclosure.
Figure 10B:
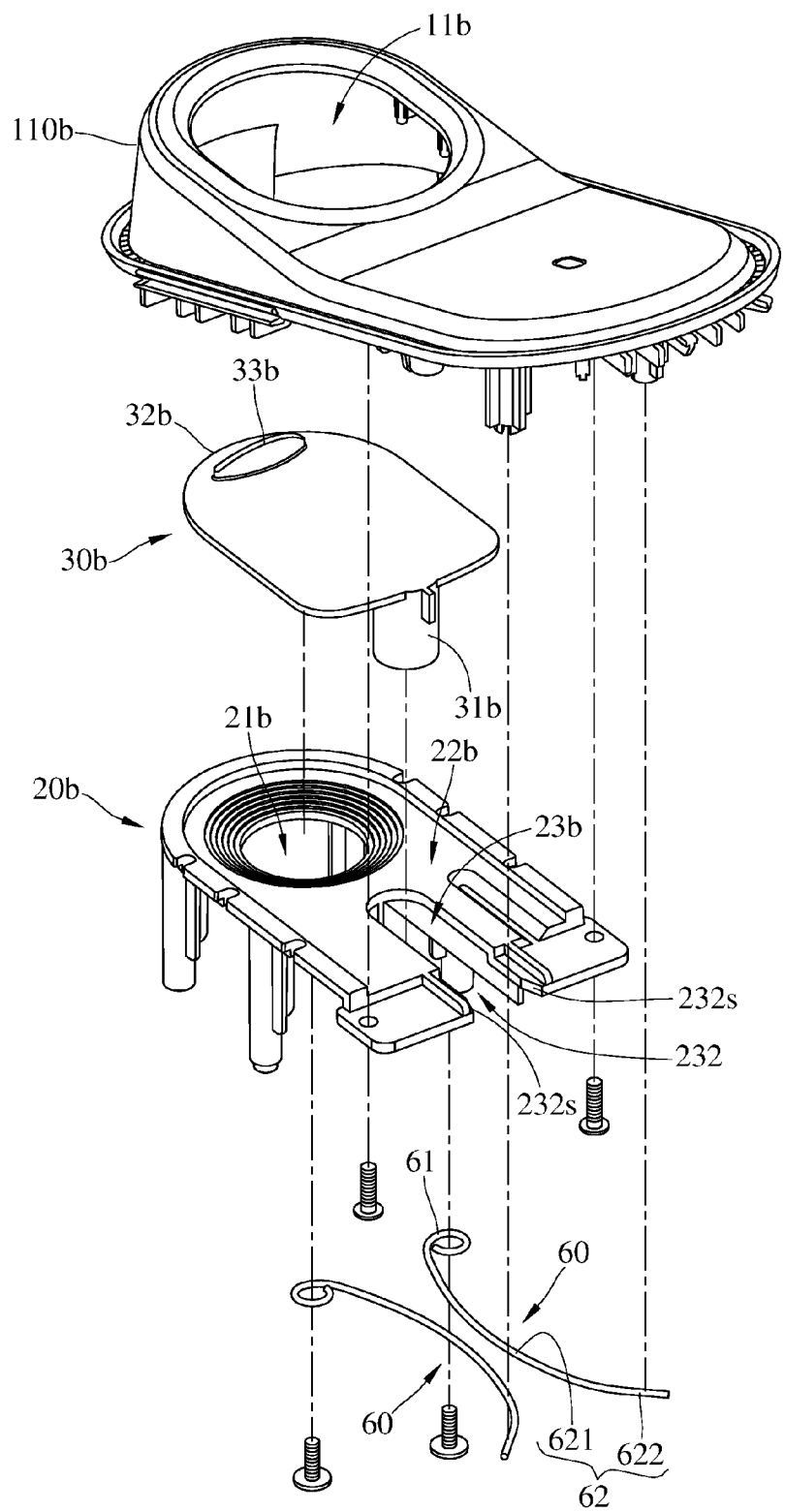
Figure 11A:
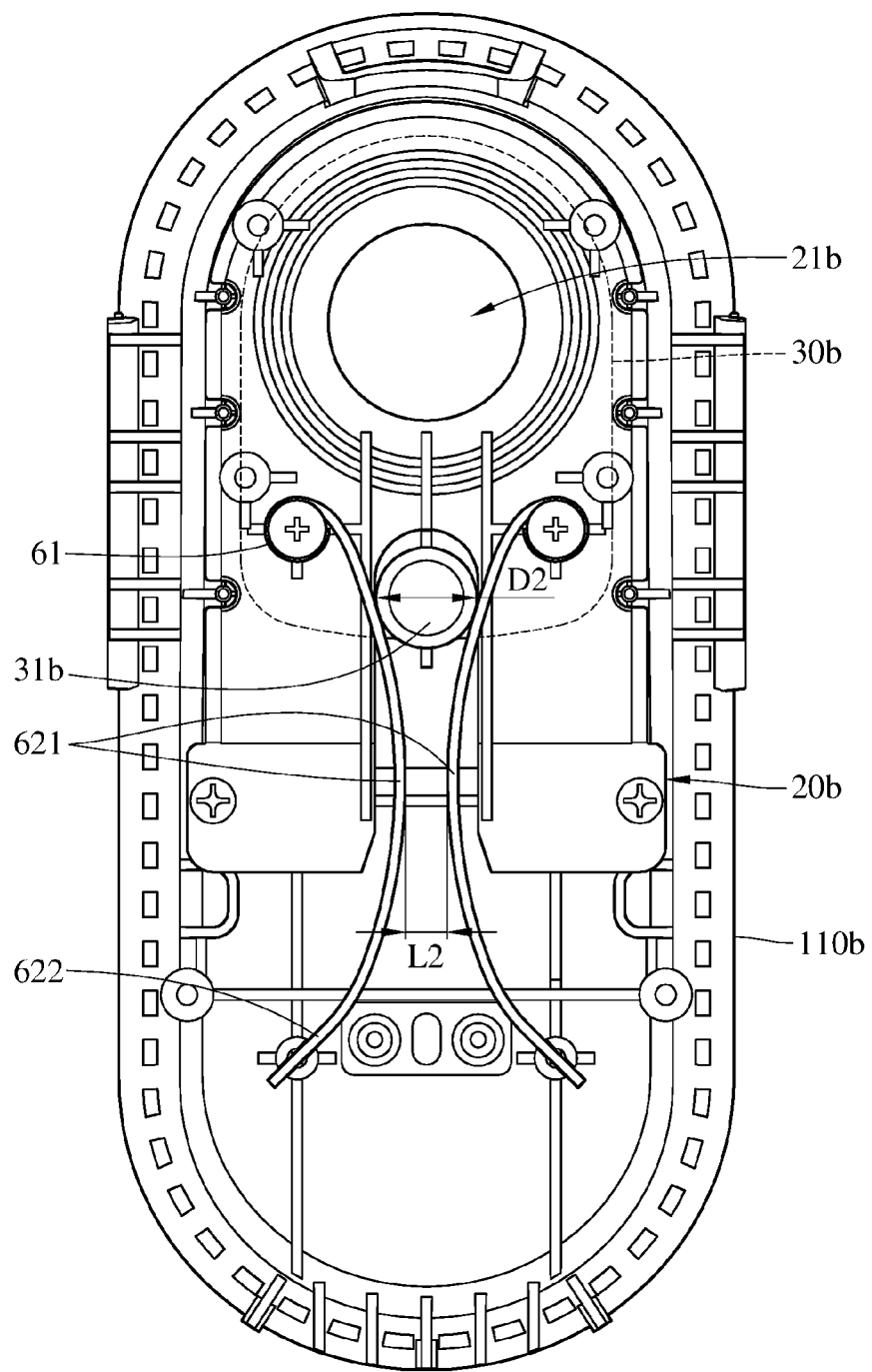
FIG. 11A is a partial front view of the electronic device when its sliding lid is located at a closed position according to the second embodiment of the disclosure.

Then, please refer to FIGS. 9-11A, FIG. 9 is a partial perspective view of the electronic device according to the second embodiment of the disclosure, FIGS. 10A-10B are partial exploded views of the electronic device taken from different viewpoints according to the second embodiment of the disclosure, and FIG. 11A is a partial front view of the electronic device when its sliding lid is located at a closed position according to the second embodiment of the disclosure. In this embodiment, the electronic device 1b further includes a supporting member 20b, a sliding lid 30b and two elastic members 60. Please refer back to FIG. 8, the supporting member 20b, the sliding lid 30b and the two elastic members 60 are accommodated in the accommodating space S2.

The supporting member 20b is disposed on the front cover 110b of the casing 10b. In this embodiment, the supporting member 20b has a through hole 21b, a first groove 22b and a second groove 23b. The through hole 21b extends through two sides of the supporting member 20b and is connected to the accommodating space S2. The first groove 22b is located on a side of the supporting member 20b which faces the window 11b. The first groove 22b is connected to the through hole 21b. The second groove 23b is located on a side of the supporting member 20b which is away from the through hole 21b. The second groove 23b has an opening 232 and two guiding surfaces 232s. The opening 232 is defined by the two guiding surfaces 232s.

In this embodiment, the sliding lid 30b is slidably located in the first groove 22b of the supporting member 20b, so the sliding lid 30b is slidable between an opened position and a closed position. The usage of the sliding lid 30b is described later in more detail.

The sliding lid 30b has a protrusion 31b, a front edge 32b and a stopper 33b. The front edge 32b means an edge of the sliding lid 30b which is close to the window 11b. The protrusion 31b protrudes from a side of the sliding lid 30b which is opposite to the window 11b, and the protrusion 31b is located on a side of the sliding lid 30b which is away from the front edge 32b. The stopper 33b protrudes from a side of the sliding lid 30b which faces the window 11b, and the stopper 33b is located in the window 11b.

In this embodiment, each of the elastic members 60 is a torsion spring having a coiled part 61 and an arm 62. The coiled parts 61 are pivoted to the supporting member 20b. Each arm 62 has a pressable section 621 and a fixed section 622. The pressable section 621 is connected between the coiled part 61 and the fixed section 622 and is located above the second groove 23b of the supporting member 20b. One end of the fixed section 622 is connected to the pressable section 621, and the other end of the fixed section 622 is movably fixed on the front cover 110b.

In addition, as shown in FIG. 11A, a distance L2 between the two pressable sections 621 is less than a distance between the two fixed sections 622 and a distance between the two coiled parts 61. That is, in one of the arms 62, the pressable section 621 is closer to the other arm 62 than its connected fixed section 622 and coiled part 61. In addition, the distance L2 between the two pressable sections 621 of the two elastic members 60 is less than a width D2 of the protrusion 31b of the sliding lid 30b. In this embodiment, the width D2 of the protrusion 31b means the outer diameter of the protrusion 31b. When the sliding lid 30b is not moved, the coiled parts 61 keep the two pressable sections 621 of the two arms 62 to be separated by the distance L2. When the sliding lid 30b is moved to press against the two pressable sections 621, the two pressable sections 632 are moved away from each other, and the two coiled parts 61 are twisted to store mechanical energy (i.e. elastic energy).

In addition, as shown in FIG. 10A or FIG. 10B, the elastic members 60 are located on the same side of the sliding lid 30b and the supporting member 20b, which makes the assembly process of the elastic members 60 easier and more efficient.

Figure 11B:
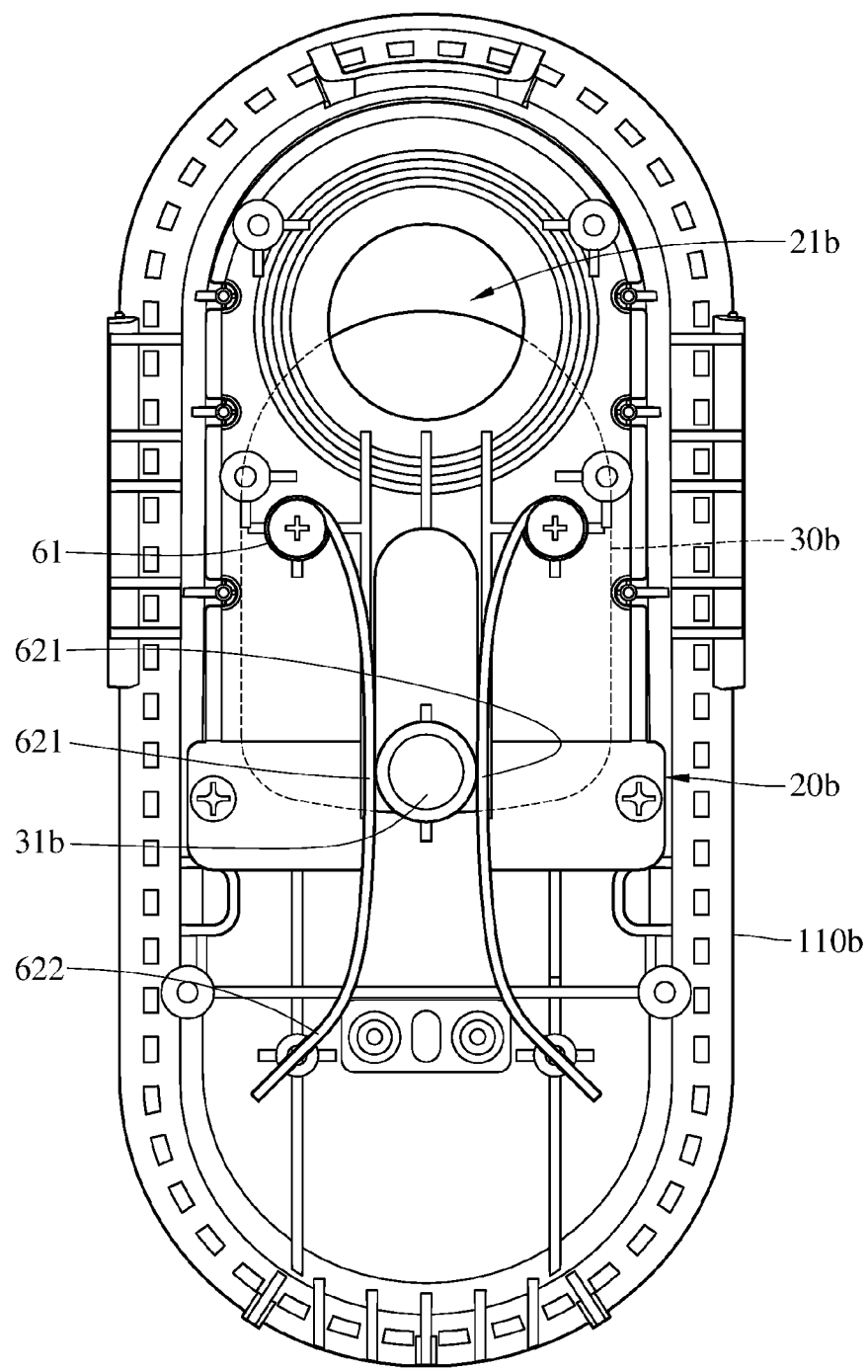
FIG. 11B is a partial back view of the electronic device when the sliding lid is located between the closed position and an opened position according to the second embodiment of the disclosure.
Figure 11C:
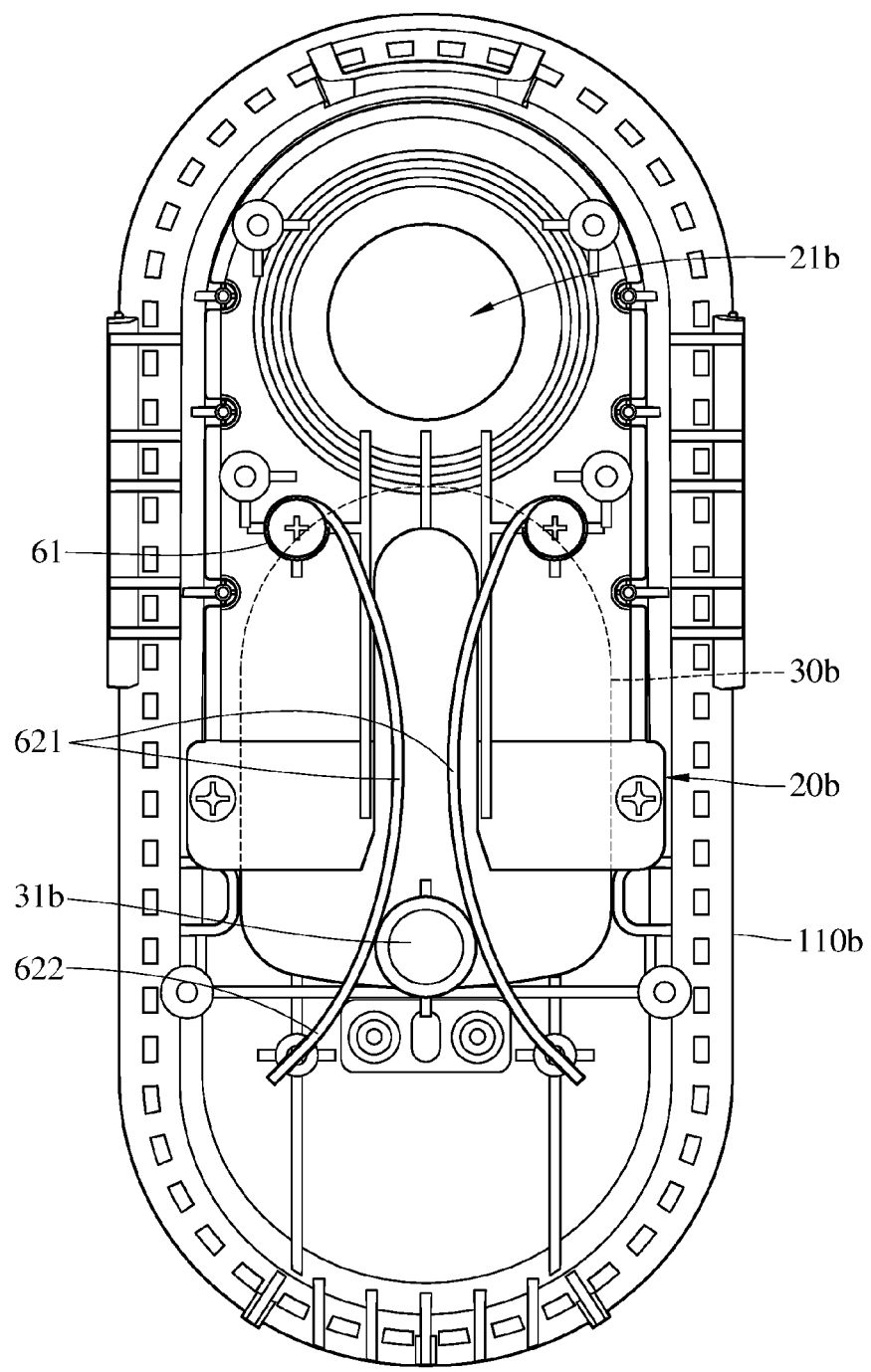
FIG. 11C is a partial back view of the electronic device when the sliding lid is located at the opened position according to the second embodiment of the disclosure.

Then, please refer to FIG. 11A and further refer to FIGS. 11B-11C, FIG. 11B is a partial back view of the electronic device when the sliding lid is located between the closed position and an opened position according to the second embodiment of the disclosure, and FIG. 11C is a partial back view of the electronic device when the sliding lid is located at the opened position according to the second embodiment of the disclosure.

Firstly, as shown in FIG. 11A, the sliding lid 30b is located at the closed position. In such a case, the sliding lid 30b is located between the window 11b of the casing 10b and the through hole 21b of the supporting member 20b so that the sliding lid 30b blocks the through hole 21b for protecting the image capturing module 9.

Then, as shown in FIG. 11B, the user is able to slide the sliding lid 30b in the direction of arrow A to away from the closed position, so the sliding lid 30b is moved away from the window 11b to leave the through hole 21b of the supporting member 20b exposed. Since the two pressable sections 621 are movable in a moving direction of the protrusion 31b, and the distance L2 between the two pressable sections 621 is less than the width of the protrusion 31b, the protrusion 31b is able to press against the two pressable sections 621 and force them to move away from each other when the protrusion 31b is moved in its moving direction. In such a case, the coiled parts 61 are twisted to store mechanical energy.

Then, please refer to FIG. 11B and further refer to FIG. 11C. During the movement of the sliding lid 30b from the position in FIG. 11B to the position in FIG. 11C, the coiled parts 61 of the elastic members 60 release the stored mechanical energy to force the two pressable sections 621 to move toward to each other, and the two pressable sections 621 squeeze the protrusion 31b and force it to move to the opened position. Therefore, the sliding lid 30b is moved to the opened position and fully opened. Hence, the sliding lid 30b is not located between the through hole 21b and the window 11b, so the through hole 21b and the window 11b are connected to each other, and the view of the image capturing module 9 is not blocked by the sliding lid 30b.

It is noted that the user is able to slide the sliding lid 30b back to the closed position by the aforementioned steps in reversed order. When the sliding lid 30b is moved from the opened position to the closed position, the two guiding surfaces 232s are able to guide the protrusion 31b to enter into the second groove 23b from the opening 232.

Figure 12:
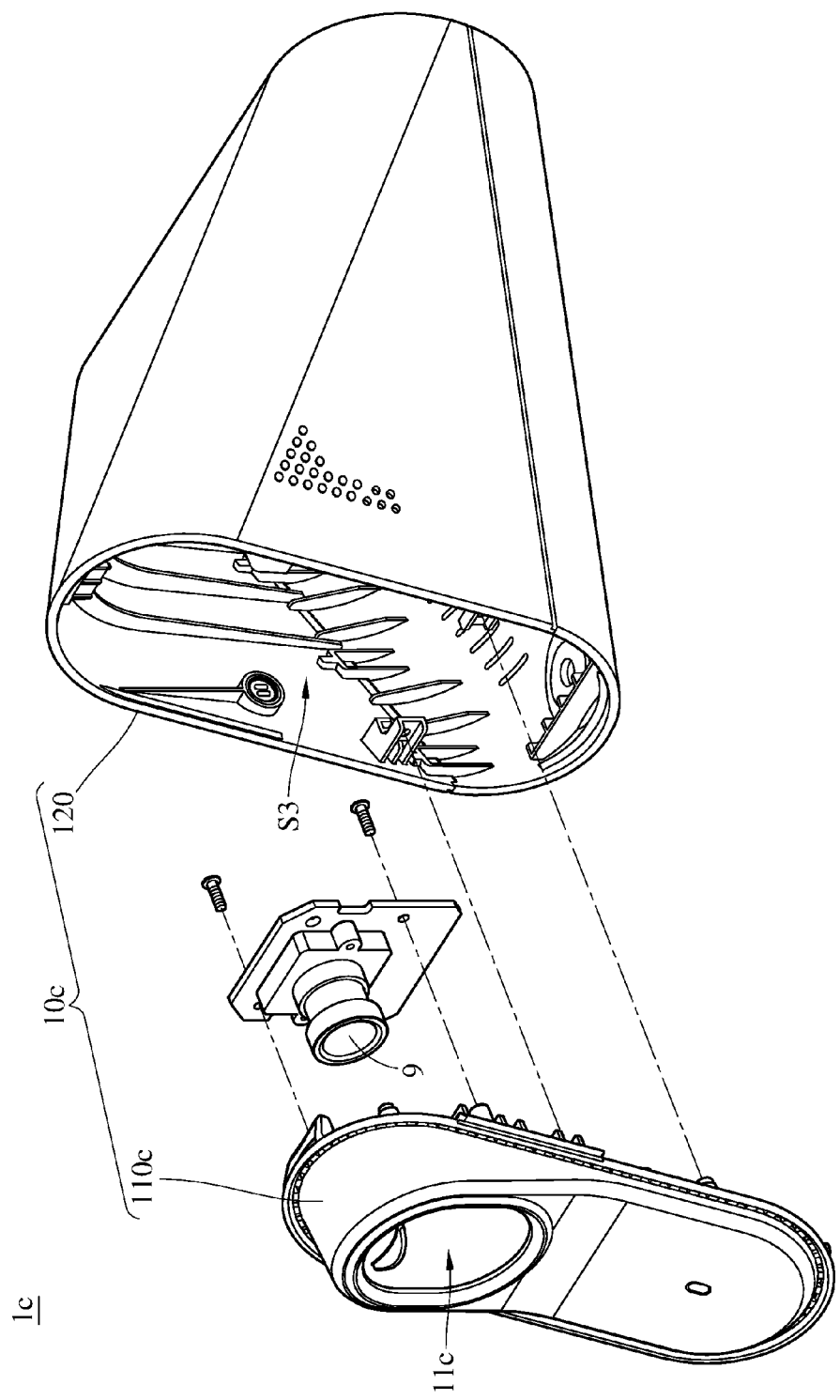
FIG. 12 is an exploded view of an electronic device according to a third embodiment of the disclosure.
Figure 13:
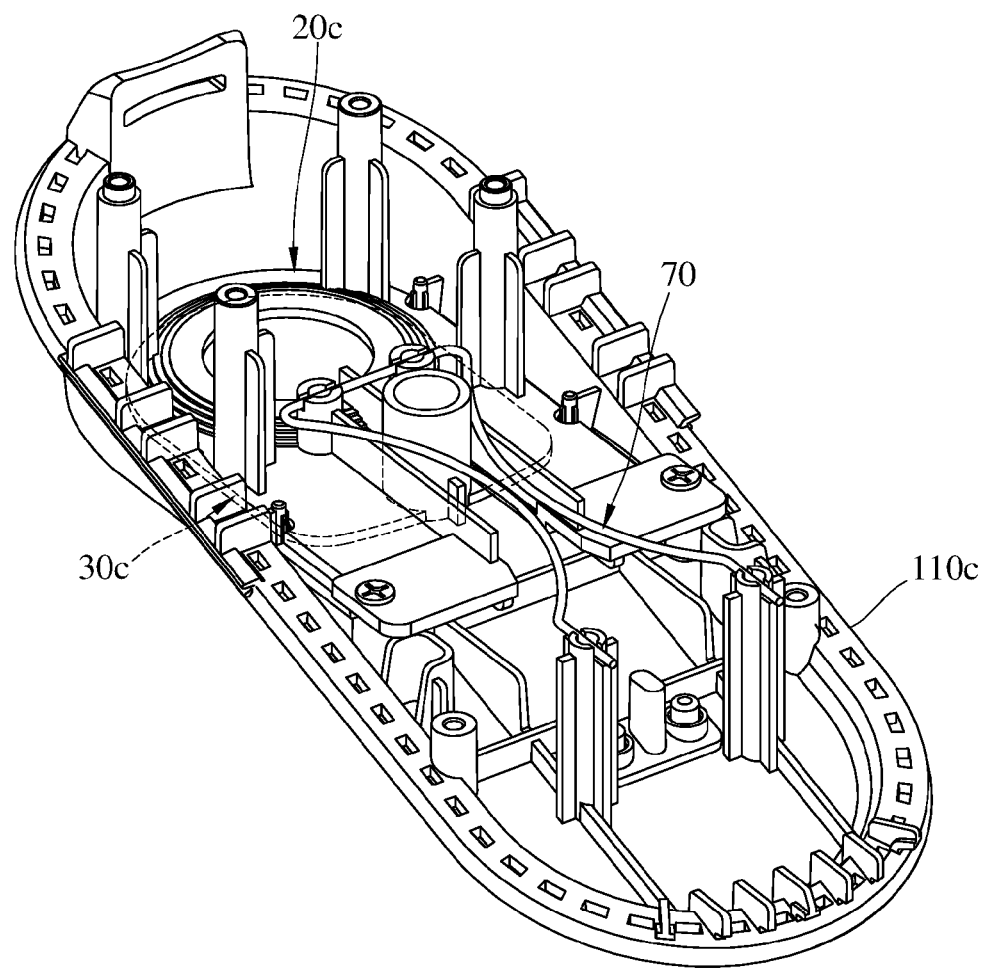
FIG. 13 is a partial perspective view of the electronic device according to the third embodiment of the disclosure.

Then, please refer to FIG. 12, which is an exploded view of an electronic device according to a third embodiment of the disclosure. In this embodiment, an electronic device 1c is provided, and the purpose and the configuration of the electronic device 1c are similar to that of the electronic device 1b. As shown in FIG. 12, the electronic device 1a includes a casing 10c and the image capturing module 9. The casing 10c includes a front cover 110c and a base 120. The front cover 110c is detachably disposed on the base 120, and the front cover 110c and the base 120 together define an accommodating space S3. The image capturing module 9 is accommodated in the accommodating space S3 for recording or capturing images. In addition, in this embodiment, the casing 10c has a window 11c located on the front cover 110c. The window 11c extends through two sides of the front cover 110c. The image capturing module 9 faces the window 11b. Furthermore, there are some other required electronic components (not shown) accommodated in the accommodating space S3, but the present disclosure is not limited thereto.

Figure 14A:
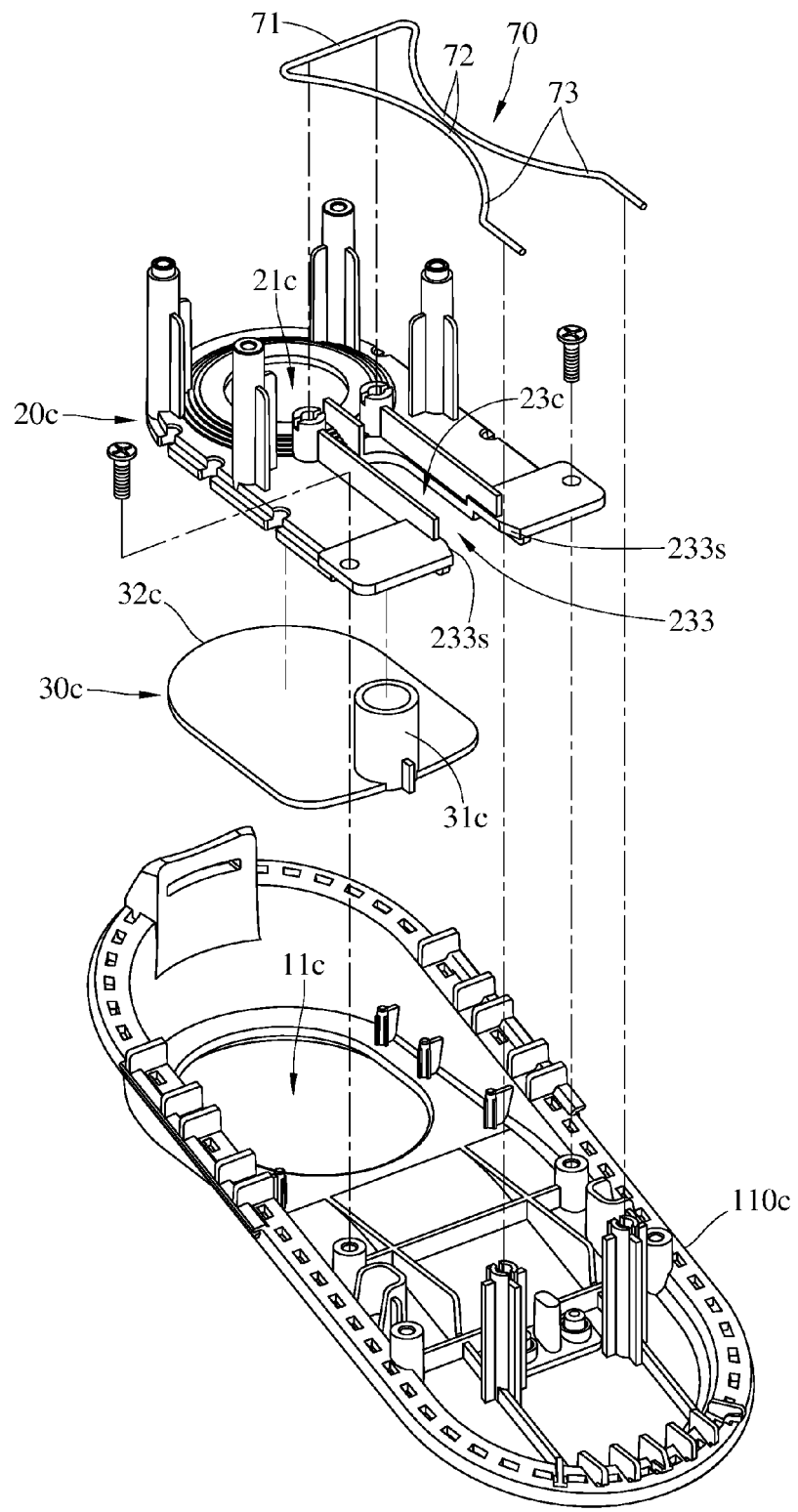
FIGS. 14A-14B are partial exploded view of the electronic device taken from different viewpoints according to the third embodiment of the disclosure.
Figure 14B:
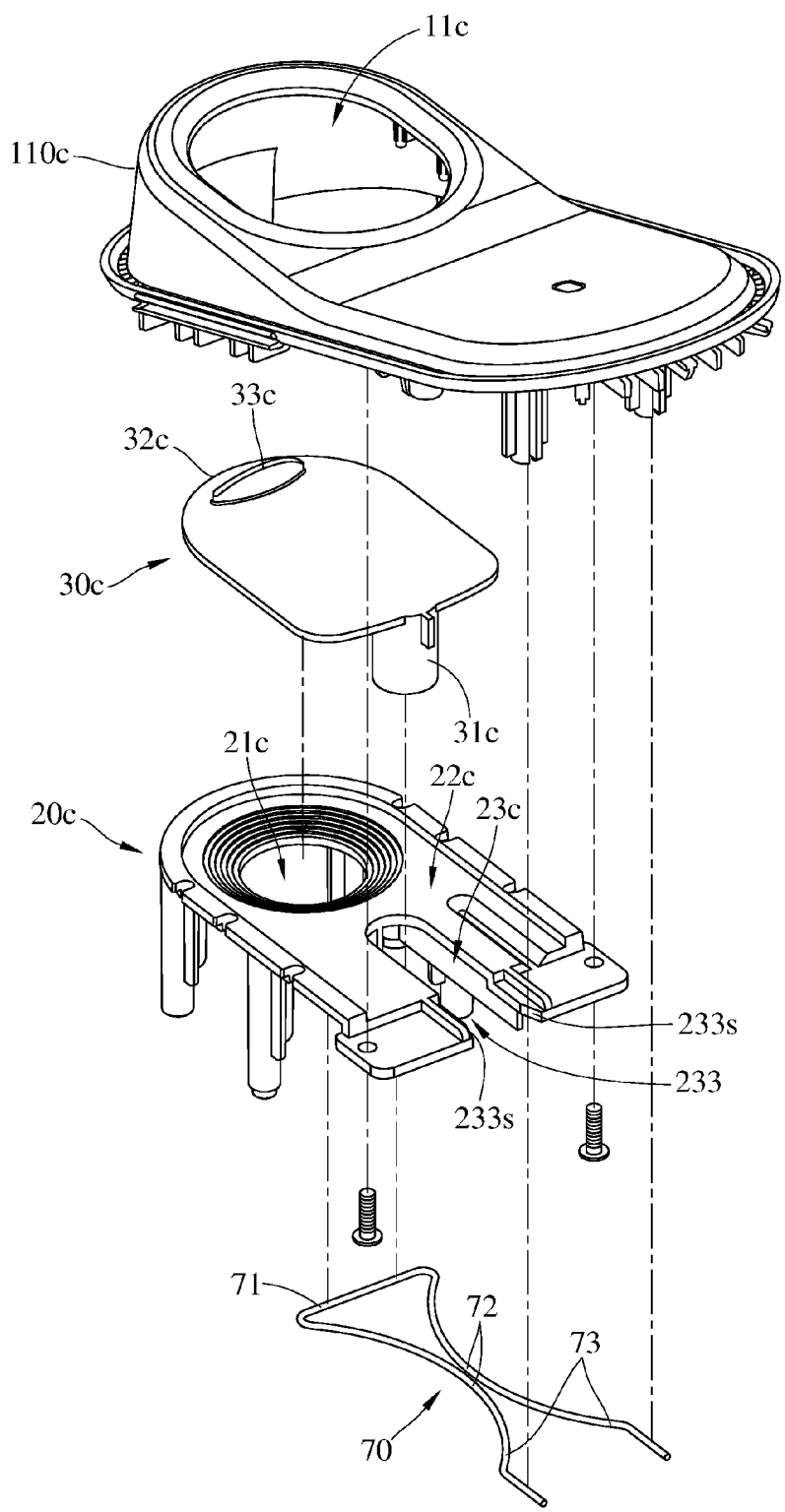
Figure 15A:
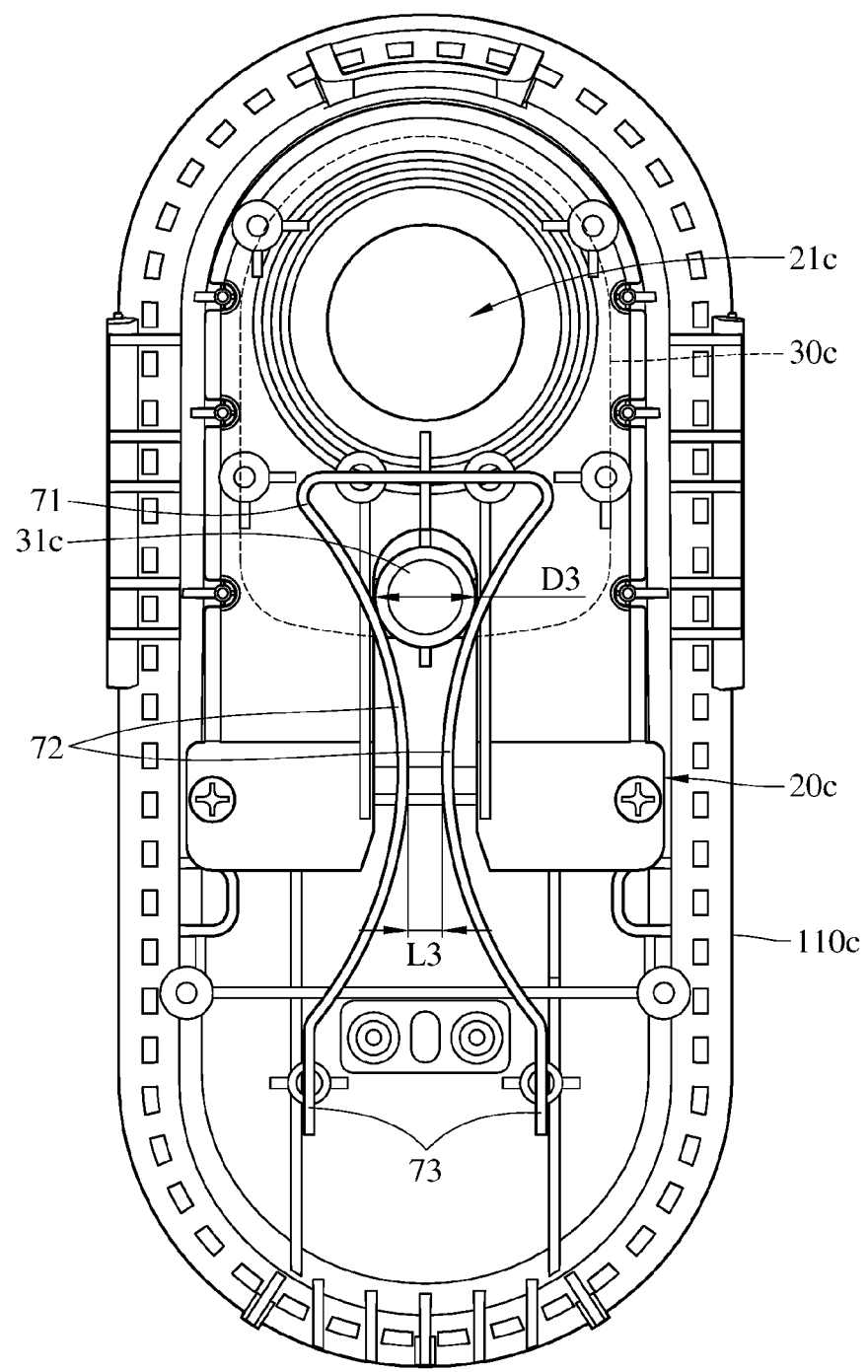
FIG. 15A is a partial back view of the electronic device when its sliding lid is located at an closed position according to the third embodiment of the disclosure.

Then, please refer to FIGS. 13-15A, FIG. 13 is a partial perspective view of the electronic device according to the third embodiment of the disclosure, FIGS. 14A-14B are partial exploded view of the electronic device taken from different viewpoints according to the third embodiment of the disclosure, and FIG. 15A is a partial back view of the electronic device when its sliding lid is located at an closed position according to the third embodiment of the disclosure.

In this embodiment, the electronic device 1c further includes a supporting member 20c, a sliding lid 30c and an elastic member 70. Please refer back to FIG. 12, the supporting member 20c, the sliding lid 30c and the elastic member 70 are accommodated in the accommodating space S3.

The supporting member 20c is disposed on the front cover 110c of the casing 10c. In this embodiment, the supporting member 20c has a through hole 21c, a first groove 22c and a second groove 23c. The through hole 21c extends through two sides of the supporting member 20c and is connected to the accommodating space S3. The first groove 22c is located on a side of the supporting member 20c which faces the window 11c. The first groove 22c is connected to the through hole 21c. The second groove 23c is located on a side of the supporting member 20c which is away from the through hole 21c. The second groove 23c has an opening 233 and two guiding surfaces 233s. The opening 233 is defined by the two guiding surfaces 233s.

In this embodiment, the sliding lid 30c is slidably located in the first groove 22c of the supporting member 20c, so the sliding lid 30c is slidable between an opened position and a closed position. The usage of the sliding lid 30c is described later in more detail.

The sliding lid 30c has a protrusion 31c, a front edge 32c and a stopper 33c. The front edge 32c means an edge of the sliding lid 30c which is close to the window 11c. The protrusion 31c protrudes from a side of the sliding lid 30c which is opposite to the window 11c, and the protrusion 31c is located on a side of the sliding lid 30c which is away from the front edge 32c. The stopper 33c protrudes from a side of the sliding lid 30c which faces the window 11c, and the stopper 33c is located in the window 11c.

In this embodiment, the elastic member 70 has a first fixed section 71, two pressable sections 72 and two second fixed sections 73. The first fixed section 71 is fixed on the supporting member 20c. The two pressable sections 72 are respectively connected to two ends of the first fixed section 71 which are opposite to each other, and the two pressable sections 72 are located above the second groove 23c of the supporting member 20c. The two pressable sections 72 are connected between the first fixed section 71 and the two second fixed sections 73. One end of one of the second fixed sections 73 is connected to one of the pressable sections 72, and the other end is movably fixed on the front cover 110c.

In addition, as shown in FIG. 15A, a distance L3 between the two pressable sections 72 is less than a width D3 of the protrusion 31c of the sliding lid 30c. In this embodiment, the width D3 of the protrusion 31c means the outer diameter of the protrusion 31c. When the sliding lid 30c is not moved, the first fixed section 71 keeps the two pressable sections 72 to be separated by the distance L3. When the sliding lid 30c is moved to press against the two pressable sections 72, the two pressable sections 72 are moved away from each other, and the first fixed section 71 is deformed or bent to store mechanical energy (i.e. elastic energy).

In addition, as shown in FIG. 14A or FIG. 14B, the elastic member 70 is located on the same side of the sliding lid 30c and the supporting member 20c, which makes the assembly process of the elastic member 70 easier and more efficient.

Figure 15B:
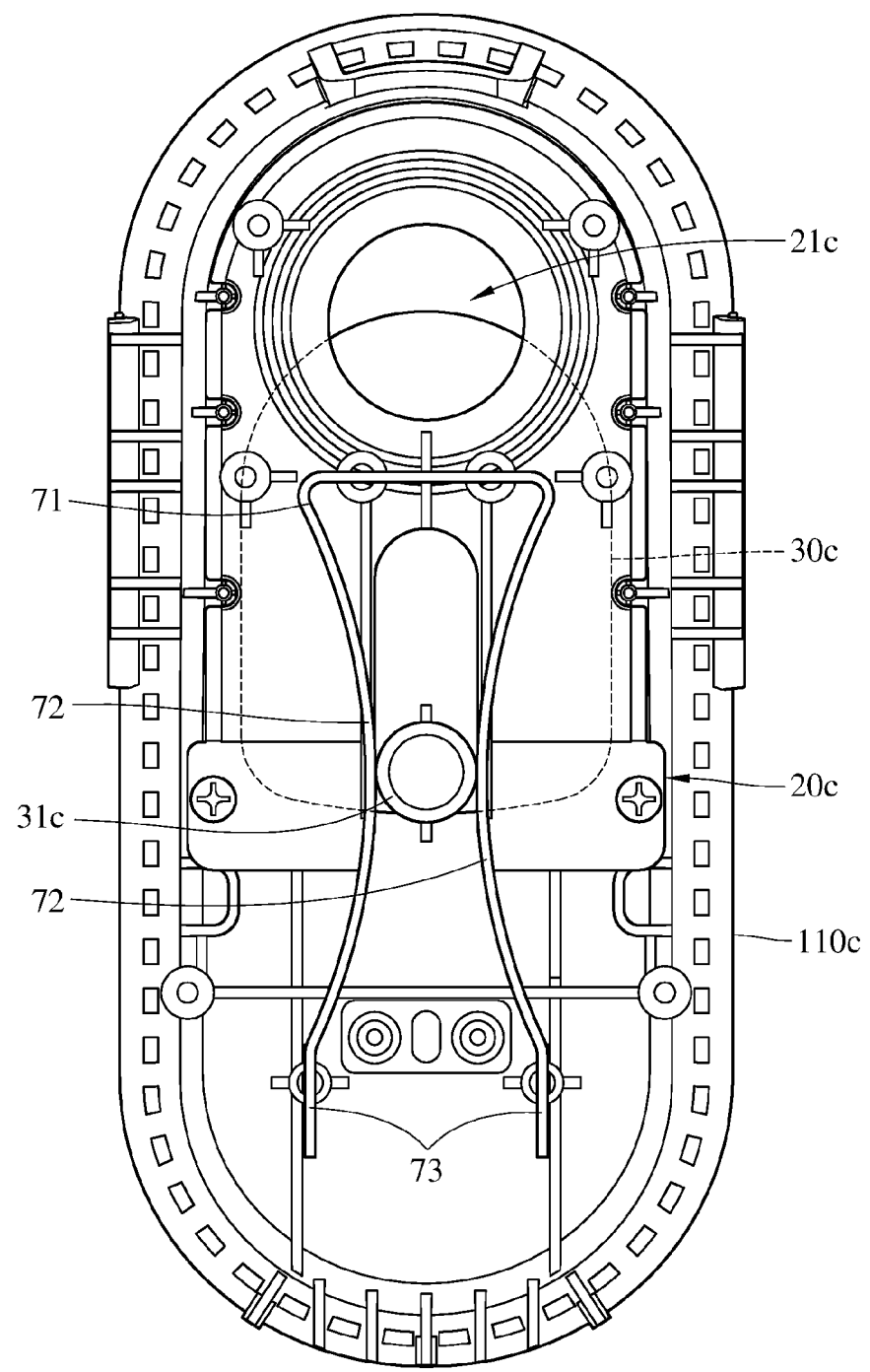
FIG. 15B is a partial back view of the electronic device when the sliding lid is located between the closed position and an opened position according to the third embodiment of the disclosure.
Figure 15C:
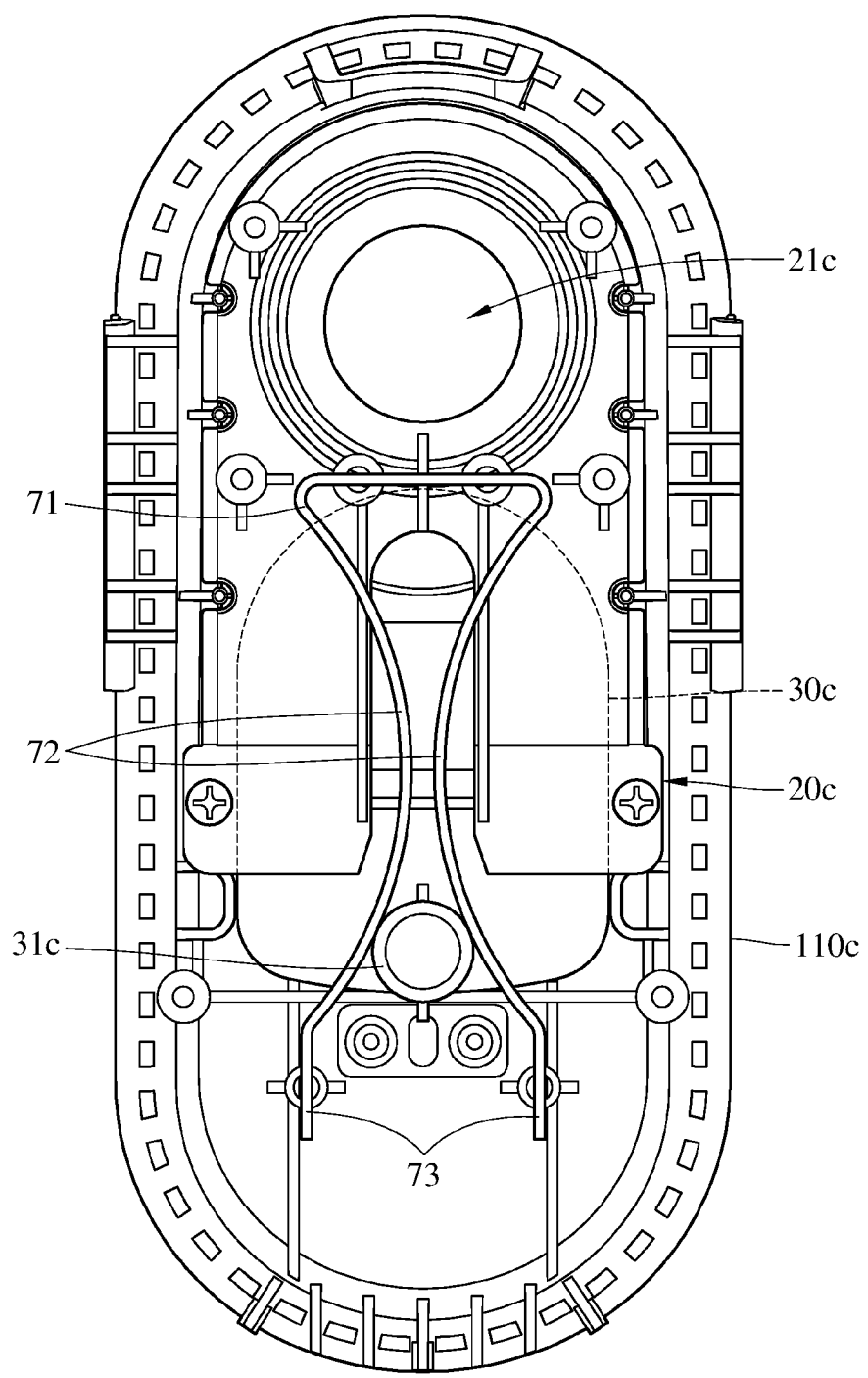
FIG. 15C is a partial back view of the electronic device when the sliding lid is located at the opened position according to the third embodiment of the disclosure.

Then, please refer to FIG. 15A and further refer to FIGS. 15B-15C; FIG. 15B is a partial back view of the electronic device when the sliding lid is located between the closed position and an opened position according to the third embodiment of the disclosure, and FIG. 15C is a partial back view of the electronic device when the sliding lid is located at the opened position according to the third embodiment of the disclosure.

Firstly, as shown in FIG. 15A, the sliding lid 30c is located at the closed position. In such a case, the sliding lid 30c is located between the window 11c of the casing 10c and the through hole 21c of the supporting member 20c so that the sliding lid 30b blocks the through hole 21c for protecting the image capturing module 9.

Then, as shown in FIG. 15B, the user is able to slide the sliding lid 30c in the direction of arrow A to away from the closed position, so the sliding lid 30c is moved away from the window 11c to leave the through hole 21c of the supporting member 20c exposed. Since the two pressable sections 72 are movable in a moving direction of the protrusion 31c, and the distance L3 between the two pressable sections 72 is less than the width D3 of the protrusion 31c, the protrusion 31c is able to press against the two pressable sections 72 and force them to move away from each other when the protrusion 31c is moved in its moving direction. In such a case, the first fixed section 71 is deformed or bent to store mechanical energy.

Then, please refer to FIG. 15B and further refer to FIG. 15C. During the movement of the sliding lid 30c from the position in FIG. 15B to the position in FIG. 15C, the first fixed section 71 of the elastic member 70 releases the stored mechanical energy to force the two pressable sections 72 to move toward to each other, and the two pressable sections 72 squeeze the protrusion 31c and force it to move to the opened position. Therefore, the sliding lid 30c is moved to the opened position and fully opened. Hence, the sliding lid 30c is not located between the through hole 21c and the window 11c, so the through hole 21c and the window 11c are connected to each other, and the view of the image capturing module 9 is not blocked by the sliding lid 30c.

It is noted that the user is able to slide the sliding lid 30c back to the closed position by the aforementioned steps in reversed order. When the sliding lid 30c is moved from the opened position to the closed position, the two guiding surfaces 233s are able to guide the protrusion 31c to enter into the second groove 23c from the opening 233.

According to the electronic devices as discussed above, the elastic member is able to force the sliding lid to move to the opened position or the closed position, so the sliding lid is able to be fully opened and closed. Therefore, the sliding lid is prevented from blocking the view of the image capturing module when the image capturing module is in use, and is able to protect the lens of the image capturing module when the image capturing module is not in use.

In addition, the elastic member is disposed on the same side of the sliding lid and the supporting member, which makes the assembly process easier and more efficient.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. An electronic device, comprising:
   a casing having a window;
   a supporting member disposed in the casing and having a through hole;
   a sliding lid slidably disposed on the supporting member so that the sliding lid is slidable between an opened position and a closed position, wherein the through hole is connected to the window when the sliding lid is located at the opened position, and the sliding lid is located between the through hole and the window when the sliding lid is located at the closed position; and an elastic member located on the same side of the sliding lid and the supporting member, one end of the elastic member disposed on the sliding lid, and another end of the elastic member disposed on the supporting member so that the elastic member releases elastic energy to force the sliding lid to move to the closed position or the opened position when the sliding lid is slid on the supporting member.

2. The electronic device according to claim 1, wherein the supporting member further has a first groove located on a side of the supporting member which faces the window, the first groove is connected to the through hole, and the sliding lid is slidably located in the first groove.

3. The electronic device according to claim 2, wherein the sliding lid has a front edge and a stopper, the stopper protrudes from a side of the sliding lid which faces the window and is located in the window, the front edge of the sliding lid abuts against a side wall of the first groove when the sliding lid is located at the closed position, the stopper of the sliding lid abuts against a side wall of the window when the sliding lid is located at the opened position.

4. The electronic device according to claim 1, wherein the elastic member is a torsion spring comprising a coiled part and two arms, the two arms are respectively connected to two sides of the coiled part which are opposite to each other, and the two arms are respectively pivoted to the sliding lid and the supporting member.

5. The electronic device according to claim 4, wherein the sliding lid has at least one protrusion, one of the two arms is pivoted to the at least one protrusion, the supporting member further has at least one second groove located on a side of the supporting member which is away from the through hole, the at least one protrusion is entered into the at least one second groove from an opening of the at least one second groove when the sliding lid slides from the opened position to the closed position.

6. The electronic device according to claim 5, wherein the at least one second groove has at least two guiding surfaces, and the opening of the at least one second groove is defined by the at least two guiding surfaces.

7. The electronic device according to claim 5, further comprising a light blocking member disposed on a side of the sliding lid which is away from the window, when the sliding lid is located at the opened position, the light blocking member blocks a light beam projected from a light emitting element to a light receiving element.

8. An electronic device, comprising:
a casing having a window;
a supporting member disposed in the casing and having a through hole;
a sliding lid slidably disposed on the supporting member so that the sliding lid is slidable between an opened position and a closed position, wherein the through hole is connected to the window when the sliding lid is located at the opened position, the sliding lid is located between the through hole and the window when the sliding lid is located at the closed position, and the sliding lid further has a protrusion which protrudes from a side of the sliding lid which is opposite to the window; and two elastic members located on the same side of the sliding lid and the supporting member, each of the two elastic members having a coiled part and an arm, wherein the coiled part is pivoted to the supporting member, the arm has a pressable section and a fixed section, the pressable section is connected between the coiled part and the fixed section, the pressable section of one of the arms is closer to the other arm than its connected fixed section and coiled part, and a distance between the two pressable sections is less than a width of the protrusion of the sliding lid;

wherein the two pressable sections are movable in a moving direction of the protrusion so that two elastic members release elastic energy to force the sliding lid to move to the closed position or the opened position when the sliding lid slides on the supporting member.

9. An electronic device, comprising:
a casing having a window;
a supporting member disposed in the casing and having a through hole;
a sliding lid slidably disposed on the supporting member so that the sliding lid is slidable between an opened position and a closed position, wherein the through hole is connected to the window when the sliding lid is located at the opened position, and the sliding lid is located between the through hole and the window when the sliding lid is located at the closed position, and the sliding lid further has a protrusion which protrudes from a side of the sliding lid which is opposite to the window; and an elastic member located on the same side of the sliding lid and the supporting member, the elastic member having a first fixed section, two pressable sections and two second fixed sections, the first fixed section fixed on the supporting member, the two pressable sections respectively connected to two sides of the first fixed section, which are opposite to each other, and respectively connected between the first fixed section and the two second fixed section, one end of each of the second fixed sections is movably fixed on the casing, and a distance between the two pressable sections is less than a width of the protrusion of the sliding lid;

wherein, the two pressable sections are movable in a moving direction of the protrusion so that the elastic member releases elastic energy to force the sliding lid to move to the closed position or the opened position when the sliding lid slides on the supporting member.

* * * * *